(12) United States Patent
Jackson et al.

(10) Patent No.: US 6,528,816 B1
(45) Date of Patent: Mar. 4, 2003

(54) INTEGRATED INORGANIC/ORGANIC COMPLEMENTARY THIN-FILM TRANSISTOR CIRCUIT AND A METHOD FOR ITS PRODUCTION

(76) Inventors: Thomas Jackson, 1348 Deerfield Dr., State College, PA (US) 16801; Mathias Bonse, 4710 Windings Creek Rd., Santa Rosa, CA (US) 95409-3435; Daniel B. Thomasson, 240 Los Alamos Rd., Santa Rosa, CA (US) 95409; Hagen Klauk, Heuweg 16, 91058 Erlangen (DE); David J. Gundlach, Apt. #36, 210 E. Hamilton Ave., State College, PA (US) 16801

(*) Notice: Subject to any disclaimer, the term of this patent is extended or adjusted under 35 U.S.C. 154(b) by 0 days.

(21) Appl. No.: 09/485,847
(22) PCT Filed: Jun. 18, 1999
(86) PCT No.: PCT/NO99/00208
 § 371 (c)(1),
 (2), (4) Date: May 29, 2001
(87) PCT Pub. No.: WO99/66540
 PCT Pub. Date: Dec. 23, 1999

Related U.S. Application Data
(60) Provisional application No. 60/089,830, filed on Jun. 19, 1998.

(30) Foreign Application Priority Data
Dec. 8, 1998 (NO) ................................................ 985729

(51) Int. Cl.[7] ........................... H01L 33/00; H01L 29/94
(52) U.S. Cl. ............................ 257/40; 257/368; 438/99
(58) Field of Search ..................... 257/40, 368; 438/99

(56) References Cited

U.S. PATENT DOCUMENTS

| | | |
|---|---|---|
| 5,347,144 A | 9/1994 | Garnier et al. |
| 5,612,228 A | 3/1997 | Sheih et al. |
| 5,625,199 A | 4/1997 | Baumbach et al. |
| 6,246,070 B1 * | 6/2001 | Yamazaki et al. |
| 6,407,408 B1 * | 6/2002 | Zhou et al. |

FOREIGN PATENT DOCUMENTS

| | | |
|---|---|---|
| EP | 334676 A2 * | 9/1989 |
| EP | A20786820 | 7/1997 |

* cited by examiner

*Primary Examiner*—Stephen D. Meier
(74) *Attorney, Agent, or Firm*—Birch, Stewart, Kolasch & Birch, LLP

(57) ABSTRACT

An integrated organic/inorganic complementary thin-film transistor circuit comprises a first and a second transistor which are operatively connected on a common substrate, wherein the first transistor is an inorganic thin-film transistor and the second an organic thin-film transistor. The inorganic thin-film transistor is an n-channel transistor and the organic thin-film transistor is a p-channel transistor or vice versa. Each of the transistors has a separate gate electrode and the organic active semiconductor material is in the case of a p-channel semiconductor in the organic thin-film transistor electrically isolated from the inorganic thin-film transistor. In a first method for fabricating a transistor circuit of this kind separate gate electrodes are deposited for each transistor on a common substrate, the material for the source and the drain electrode of the organic thin-film transistor are deposited on the same layer level in the thin-film structure of the organic thin-film transistor and in each case the organic active semiconductor material in an organic p-channel transistor is provided electrically isolated from the inorganic n-channel transistor, and the organic active semiconductor material in an organic n-channel transistor optionally electrically isolated from the inorganic p-channel transistor.

16 Claims, 21 Drawing Sheets

Figure 1:
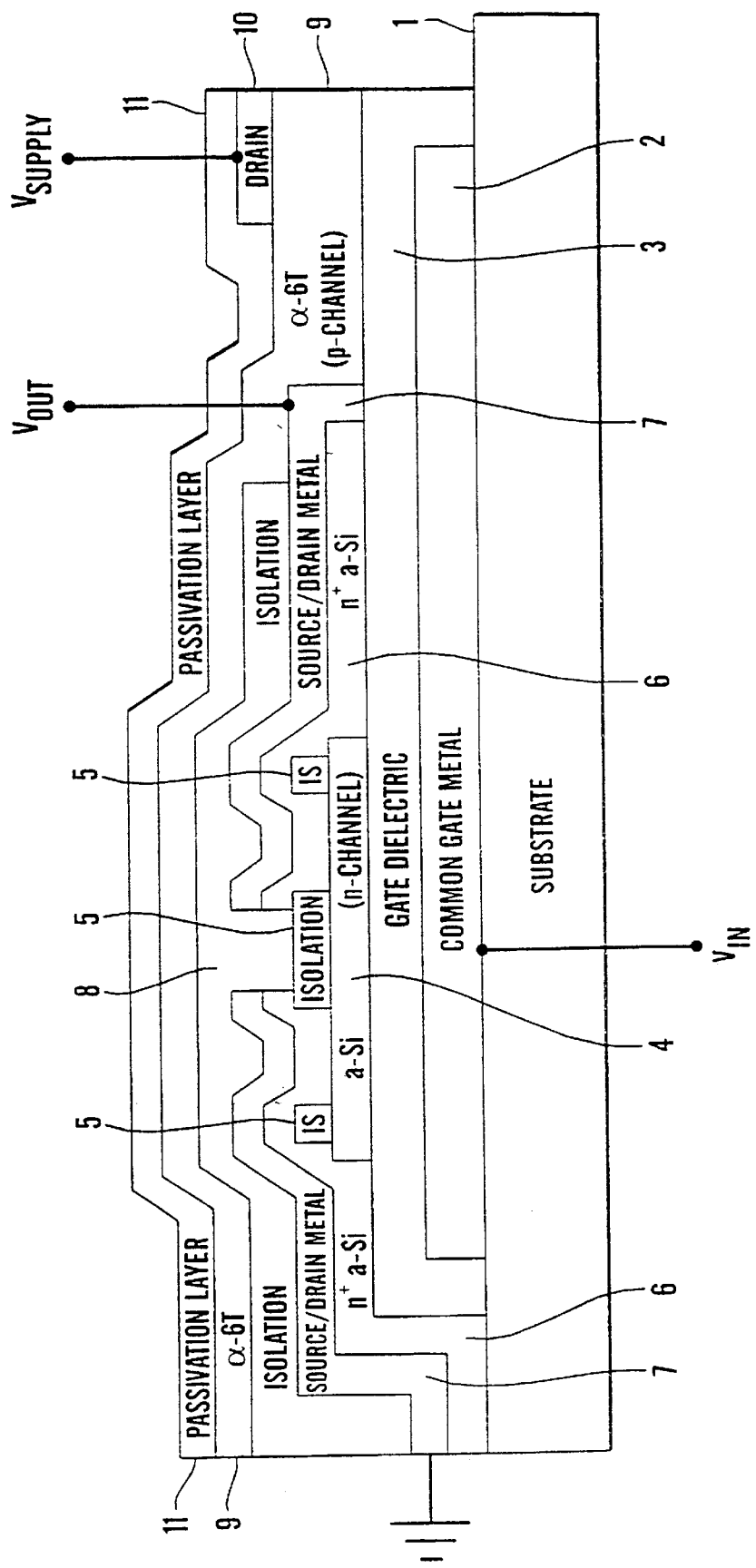

SPUTTER OF GATE METAL:

DEFINITION OF GATE METAL PATTERN (MASK I):

PECVD OF TRI-LAYER:

PATTERNING OF PHOTORESIST FOR ACTIVE DEFINITION OF a-Si:H TFTs (MASK II):

ETCHING OF TOP NITRIDE LAYER:

ETCHING OF a-Si:H LAYER:

PATTERNING OF PR FOR ETCH OF I-STOPPER AND BOTTOM NITRIDE LAYER (MASK III):

ETCHING OF I-STOPPER AND BOTTOM NITRIDE LAYER:

PECVD OF $n^+$ a-Si:H:

PATTERNING OF PR FOR LIFTOFF (MASK IV):

SPUTTERING OF SOURCE / DRAIN METAL OF a-Si:H TFTs:

LIFTOFF OF a-Si:H SOURCE / DRAIN METAL:

ETCHING OF n⁺ LAYER:

PATTERNING OF PHOTORESIST FOR LIFTOFF OF ORGANIC TFT METALLIZATION (MASK V):

DEPOSITION OF TOP METALLIZATION:

LIFTOFF OF TOP METALLIZATION:

DOUBLE LAYER LITHOGRAPHY FOR ISOLATION:

DEPOSITION OF PENTACENE ORGANIC SEMICONDUCTOR:

VOLTAGE TRANSFER CURVE OF a-Si:H / PENTACENE INVERTER

TRANSIENT CURRENT OF a-Si:H / PENTACENE INVERTER

INTEGRATED INORGANIC/ORGANIC COMPLEMENTARY THIN-FILM TRANSISTOR CIRCUIT AND A METHOD FOR ITS PRODUCTION

This application is the national phase under 35 U.S.C. § 371 of PCT International Application No. PCT/NO99/00208 which has an International filing date of Jun. 18, 1999, which designated the United States of America.

The invention concerns an integrated inorganic/organic complementary thin-film transistor circuit comprising a first and a second transistor which are operatively connected and provided on a common substrate, wherein the first transistor is an inorganic thin-film transistor and the second transistor an organic thin-film transistor, wherein the separate gate electrodes are provided for each of the transistors, and wherein the complementary thin-film transistor circuit forms a multilayer thin-film structure.

The present invention also concerns a method for fabricating an integrated inorganic/organic complementary thin-film transistor circuit comprising a first and a second transistor which are operatively connected and provided on a common substrate, wherein the first transistor is an inorganic thin-film transistor and the second transistor a organic thin-film transistor, and wherein the complementary thin-film transistor circuit forms a multilayer thin-film structure with successively deposited and patterned thin-film layers, and wherein the method comprises depositing separate gate electrodes for respectively the first and the second transistor on a common substrate, and depositing material for the source electrode and the drain electrode of the organic thin-film transistor on the same level in the thin-film structure of the organic thin-film transistor.

Finally the present invention concerns a method for fabricating an integrated inorganic/organic complementary thin-film transistor circuit, comprising a first and a second transistor which are operatively connected and provided on a common substrate, wherein the first transistor is an inorganic thin-film transistor and the second transistor an organic thin-film transistor, and wherein the complementary thin-film transistor circuit forms a multilayer thin-film structure with successively deposited and patterned thin-film layers.

Integrated circuits of silicon realized as complementary metal-oxide semiconductors dominate the markets for a number of microelectronic applications such as microprocessors. But complementary circuits may also be of interest for more general application, e.g. in portable battery-operated electronic products, as they can provide very low static power dissipation for digital circuits. It has, however, turned out to be difficult to realize complementary integrated thin-film circuits with sufficient performance for commercial applications.

Hydrogenated thin-film transistors of silicon (a-Si:H TFT) have found a new application in thin-film components, particularly in liquid crystal displays with active matrix. However, complementary a-Si:H circuits are problematic, as the hole transport mobility typically is much lower than the electron transport mobility. Recently TFTs with organic active layers have been fabricated and with performance comparable to that which can be obtained with amorphous silicon devices (a-Si:H devices).

For instance there is in U.S. Pat. No. 5,347,144 (Garnier & al.) disclosed a thin-film field-effect transistor with an MIS structure which includes a thin semiconductor layer between the source and drain electrode. The thin semiconductor layer contacts a surface of a thin-film made of isolating material which at its second surface contacts a conducting grid. The semiconductor is made of at least one polyconjugated organic compound with a determined molecular weight. As organic semiconductor material Garnier & al. among others mention different various aromatic polycyclic hydrocarbons and among these polyacenes. The transistor of Garnier & al. is stated to be particularly suited as a switching or amplifying device.

Also simple organic complementary thin-film transistor circuits have been discussed in the literature, but have not shown the desired performance properties. Further attempts have been made building complementary circuits with combinations of inorganic and organic devices on separate substrates and with external connection.

In U.S. Pat. No. 5,625,199 (Baumbach & al.) there is, however, disclosed a complementary circuit with an inorganic n-channel thin-film transistor and an organic p-channel thin-film transistor. The n-channel thin-film transistor employs hydrogenated amorphous silicon as active material and the p-channel of the organic thin-film transistor employs $\alpha$-hexathienylene ($\alpha$-6T) as active semiconductor material. The complementary thin-film transistor circuit according to Baumbach & al. can be used for implementing an integrated complementary inverter or other complementary circuits.

The integrated complementary inorganic/organic thin-film transistor according to Baumbach & al. is, however, encumbered with a number of disadvantages both from a processual point of view as well as with regard to general application in more comprehensive transistor circuits. Thus Baumbach & al. propose to provide respectively the source and drain electrodes on both sides of the organic semiconductor layer, something which firstly is not necessary and additionally comports a number of disadvantages in the fabrication. Further the source and drain contacts of the organic thin-film transistor must be formed in different steps and it will also be difficult to pattern contacts on the top of the organic semiconductor unless shadow masks are used.

Nor has the complementary thin-film transistor according to Baumbach an isolated organic semiconductor material in the organic thin film transistor. As it will be desirable to be able to turn the inorganic transistor on and to turn the organic transistor off or vice versa using potential with the same sign, this may be problematic. In the complementary thin-film transistor according to Baumbach & al. it is probable that an undesirable large leakage will be problematic if the complementary thin-film transistor shall be used in complex circuits. An inverter realized according to Baumbach & al. switches as stated in the cited U.S. patent at about 5 V at a supply voltage of 7.2 V. Another disadvantage of the complementary thin-film transistor according to Baumbach & al. is that a common gate electrode is used both for the n-channel and the p-channel transistor. More complex transistor circuits built from complementary devices shall require that common electrodes are not used in these. Even in simple inverters a common gate electrode will give increased stray capacitance. Further it shall be remarked that the complementary thin-film transistor according to Baumbach & al. uses the inorganic transistor as n-channel transistor and the organic transistor as p-channel transistor, something which is understandable in light of the materials proposed. It is, however, evident from Baumbach & al. that the use of organic materials which may be used for forming active semiconductors of the n-type demands relatively complicated and costly fabricating processes and hence is not easy to realize for the time being.

In U.S. Pat. No. 5,162,228 (Shieh & al.) there is disclosed a method of fabricating a thin-film transistor with separate gate electrodes. The inorganic and organic thin-film transistors are of the n type and p type respectively and are shown integrated into a complementary circuit with the source and drain electrodes in both transistors being on the same respective levels. The organic thin-film transistor is shown patterned with an active semiconductor material of the p type and it is evident that the problem with stray capacitance essentially may be avoided. Shieh & al. relies on low-temperature processes in the deposition of the active semiconductor materials, but does not consider the problem inherent in the conventional patterning methods applied to an organic semiconducting material. Neither is the device as disclosed by Shieh & al. amenable to embodiments with n-type organic materials, particularly as the metal electrodes are deposited on the top of the n-type transistor's active and patterned semiconductor material.

A first object of the present invention is hence to overcome the disadvantages which are connected with prior art and particularly to provide an integrated complementary inorganic/organic thin-film transistor circuit which is suited for use in large transistor circuits. Another object is to provide complementary thin-film transistor circuits which allow a cheap fabrication and simultaneously have low static power consumption, such that they can be used in portable battery-operated equipment.

A further object of the present invention is to provide an uncomplicated and inexpensive method for fabricating integrated complementary inorganic/organic thin-film transistor circuits and this in as few process steps as possible, while a device with good electric properties is obtained and whereby it particularly shall be possible to realize the inorganic transistor as an n-channel transistor and the organic transistor as a p-channel transistor or vice versa.

The above-mentioned and other objects are achieved according to the invention with an integrated inorganic/organic complementary thin-film transistor circuit which is characterized in that the inorganic thin-film transistor is an n-channel transistor and that the organic thin-film transistor is a p-channel transistor, or vice versa, the organic active transistor material in each case being respectively a p-channel organic semiconductor material or an n-channel organic semiconductor material, that the organic semiconductor material is provided in a substantially global layer over at lease one suitably patterned isolating layer on the top of the circuit, such that said isolation layer or layers is/are broken in the region of the second transistor, whereby the organic active semiconductor in the second transistor in any case contacts the source and drain electrodes thereof and is provided in complete electrical isolation against the first transistor.

According to the invention the inorganic active semiconductor material is advantageously selected among hydrogenated amorphous silicon (a-Si:H), hydrogenated or unhydrogenated microcrystalline silicon ($\mu$c-Si:H;$\mu$c-Si), hydrogenated or unhydrogenated polycrystalline silicon (pc-Si:H;pc-Si), single crystal silicon, copper-doped polycrystalline germanium (pc-Ge:Cu), cadmium selenide (CdSe), cadmium telluride (CdTe), or composite inorganic semiconductors based on said materials, possibly in single crystal form.

Where the inorganic thin-film transistor is an n-channel transistor, the inorganic active semiconductor material is preferably amorphous silicon (a-Si:H), and where the inorganic transistor is a p-channel transistor, the inorganic active semiconductor material is preferably a p-channel silicon material, particularly p-channel hydrogenated amorphous silicon (a-Si:H).

In an advantageous embodiment the active semiconductor material in the inorganic thin-film transistor comprises at least one polyconjugated organic compound with a specific molecular weight. It is then advantageous that the polyconjugated organic compound or compounds are selected selected among conjugated oligomers, polycyclic aromatic hydrocarbons, particularly polyacenes, or polyenes.

Where the organic thin-film transistor is a p-channel transistor, it is advantageous that the organic active semiconductor material is pentacene, and where the organic thin-film transistor is an n-channel transistor, it is advantageous that the organic active semiconductor material is copper hexadecafluorophtalocyanide.

Finally, it is according to the invention particularly advantageous that the source electrode and the drain electrode of the organic thin-film transistor is provided in one and the same level in the thin-film structure of the organic thin-film transistor.

A first method for fabricating an integrated inorganic/organic thin-film transistor circuit is according to the invention characterized by forming the inorganic thin-film transistor as an n-channel transistor and the organic thin-film transistor as a p-channel transistor by depositing respectively an n-channel inorganic active semiconductor material and a p-channel organic active semiconductor material or correspondingly forming the organic thin-film transistor as an n-channel transistor and the inorganic thin-film transistor as a p-channel transistor by depositing respectively an n-channel organic active semiconductor material and a p-channel inorganic active semiconductor material, providing in any case at least one global isolating layer over first transistor and broken in the region of the second transistor by a suitable patterning to expose the source and drain electrodes and the gate isolator of the second transistor, and providing the organic active semiconductor material in a global layer on the top of the isolating layer or layers and such that it covers the exposed portion of the second transistor, whereby the active organic semiconductor in the second transistor is provided contacting the source and drain electrodes thereof and in complete electrical isolation against first transistor by a re-entrant edge of the broken profile of the isolating layer or layers.

A second method for fabricating an integrated inorganic/organic complementary thin-film transistor circuit is according to the invention characterized by comprising steps for depositing separate gate electrodes of a first metal for each of the two transistors on a common substrate, depositing separate inorganic isolators of silicon nitride (SiN$_x$) over each gate electrode, depositing an inorganic active semiconductor in the form of hydrogenated amorphous silicon (a-Si:H) above one of the gate electrodes which thus forms the gate electrode of the first transistor, depositing and patterning an n$^+$ doped layer of either hydrogenated amorphous silicon (n$^+$a-Si:H) or hydrogenated microcrystalline silicon (n$^+$ $\mu$c-Si:H) or hydrogenated polycrystalline silicon (n$^+$pc-Si:H) as source and drain contacts for the first transistor, depositing and patterning the source and drain electrodes of the first transistor in form of a second metal over the source and drain contacts thereof, depositing and patterning the source and drain electrodes for the second transistor in the form of a third metal in the same layer level in the thin-film structure, forming an isolating double layer over the whole organic thin-film transistor and patterning this such that the source and drain electrodes and the gate isolator in the second transistor become exposed, whereafter a layer of pentacene is deposited above the isolating double layer and the exposed portion of the second transistor, the pentacene layer in the exposed portion forming the active semiconductor material of the organic thin-film transistor and being provided electrically isolated against the additional pentacene layer broken by a re-entrant edge of the profile of the isolating double layer.

In an advantageous embodiment of the last-mentioned method according to the invention the steps for forming the inorganic thin-film transistor are realized in a tri-layer process which forms an inverted staggered three-layer structure.

In another advantageous embodiment of the last-mentioned method according to the invention the steps for forming the inorganic thin-film transistor are realized in a back-channel etch process.

In an advantageous embodiment of the last-mentioned method according to the invention the active semiconductor in the form of pentacene in the organic thin-film transistor is isolated by a re-entrant profile of a broken double layer of polymethylmetacrylate (PMMA) and Novolac photoresist.

In an advantageous embodiment of the last-mentioned method according to the invention gold is evaporated thermally for forming the source and drain electrodes of the organic thin-film transistor.

Finally, the pentacene layer which is deposited over the isolating double layer can be removed.

The invention shall now be explained in more detail in connection with exemplary embodiments and with reference to the accompanying drawings wherein FIG. 1 shows a complementary thin-film transistor circuit according to prior art as exemplified by the above-mentioned U.S. Pat. No. 5,675,199, FIG. 2a a first embodiment of the complementary thin-film transistor circuit according to the invention, FIG. 2b a second embodiment of a complementary thin-film transistor circuit according to the invention, FIG. 2c a variant of the embodiment in FIG. 2b, FIG. 3a a third embodiment of the complementary thin-film transistor circuit according to the invention, FIG. 3b a fourth embodiment of the complementary thin-film transistor circuit according to the invention, FIG. 3c a fifth embodiment of the complementary thin-film transistor circuit according to the invention, FIG. 3d a variant of the embodiment in FIG. FIG. 3c, FIGS. 4a–4r schematically the process steps in an embodiment of a method according to the present invention, FIGS. 5a–5d a tri-layer etch process as used with a method according to the present invention, FIGS. 6a–6c a back-channel etch process as used with a method according to the present invention, FIG. 7a schematically a section through an inverter realized with the complementary thin-film transistor circuit according to the present invention, FIG. 7b the circuit diagram of the inverter in FIG. 7a, FIG. 7c a line drawing based on a microphotograph of the actual inverter in FIG. 7a realized in thin film technology, FIG. 8a the voltage transfer curve for an inverter realized as in FIG. 7a, FIG. 8a a diagram of the transient current for an inverter realized as in FIG. 7a, FIG. 9a a line drawing based on a microphotograph of an actual NAND gate realized with complementary thin-film transistor circuits according to the present invention, FIG. 9b a circuit diagram of the NAND gate in FIG. 9a, FIG. 9c the output voltage of the NAND gate in FIG. 9a, FIG. 10 a line drawing based on a microphotograph of an actual five-stage ring oscillator realized with complementary thin-film transistor circuits according to the present invention, FIG. 11 the circuit diagram of the ring oscillator in FIG. 10, FIGS. 12a–12c respectively the gate delay, the power dissipation and the power dissipation product for the ring oscillator in FIG. 10 as function of the supply voltage, and FIGS. 13a–c respectively the gate delay, the power dissipation and the power dissipation product as function of the supply voltage for an eleven-stage ring oscillator realized with complementary thin-film transistor circuits according to the present invention.

First there shall now be given a discussion of prior art with the above-mentioned U.S. Pat. No. 5,625,199 (Baumbach & al.) as starting point. Therein is disclosed a complementary circuit with inorganic n-channel thin-film transistor and an organic p-channel thin-film transistor, such as rendered in FIG. 1. For both transistors a common gate electrode 2 of metal is provided on a substrate 1. Over the gate electrode is provided a dielectric 3 which forms the gate isolator and which typically is made of a non-conducting polymer. Over the gate isolator 3 then follows a layer 4 of undoped amorphous silicon which forms the active layer of the inorganic n-channel transistor. On the a-Si layer 4 is provided a patterned isolation layer 5 which serves to prevent short circuit between the source and drain areas of the n-channel transistor. Over the layers 3, 4 and 5 a further layer 6 of n$^+$ amorphous silicon has been deposited and provides electrical contact to the active amorphous silicon layer 4. The source/drain electrodes 7 are deposited patterned such that the source electrode and drain electrode of the n-channel transistor are not short-circuited. The metal layer 7 is besides patterned such that the n-channel and the p-channel transistors in the circuit are connected. Consequently the layer 7 extends towards the p-channel transistor and forms the source contact therein. Now follows a layer 8 of an isolating material, for instance silicon nitride, polyimide or another dielectric in order to isolate the source/drain electrodes 7 against the active organic semiconductor layer 9 which is formed of α-hexathienylene (α-6T) and which for instance may be deposited by vacuum sublimation. Finally, the prior art circuit comprises the drain electrode 10 of the p-channel transistor. The contact metal may be made of an evaporated or sputtered layer of Au or Ag and will be connected to the positive supply voltage. This prior art complementary transistor circuit is then in a final step coated with a passivation layer 11, e.g. of silicon nitride or polyimide, to protect the circuit.

Figure 2A:
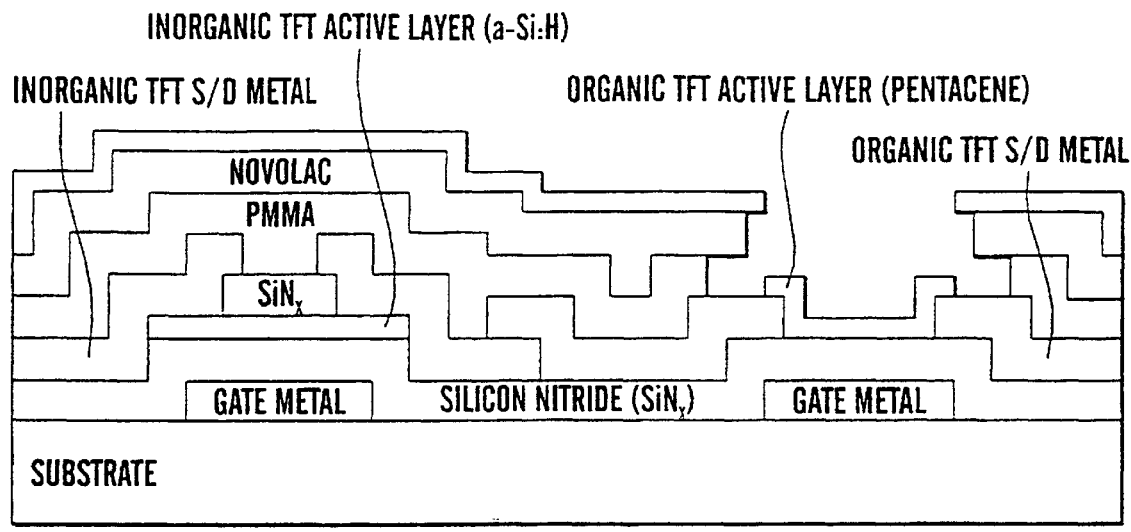

A section through a first embodiment of a complementary transistor circuit according to the present invention is shown in FIG. 2a. Separate gate electrodes for respectively the inorganic and the organic transistor are deposited on a substrate and covered by a layer of silicon nitride which forms the gate isolator. The inorganic active semiconductor material is here shown in the form of hydrogenated amorphous silicon (a-Si:H) and provided such that it registers with the gate electrode of the inorganic transistor, but also extends beyond this where it forms n$^+$ doped areas for source and drain in the inorganic transistor. The contact material proper for the drain or source electrode is itself then deposited over the active semiconductor material and mutually isolated by a patterned isolation layer of silicon nitride. The material of the source electrode of the inorganic transistor may be of another metal than the metal in the gate electrode. Correspondingly the contact material for the source and drain electrodes of the organic transistor is deposited over the gate isolator such that the source and drain electrodes of the organic transistor in each case are located on the same level in the thin-film structure. Over both the inorganic and the organic transistors' source and drain contacts a double layer of respectively polymethylmetacrylate and Novolac photoresist is provided, but patterned such that the portion between the source and drain electrodes in the organic transistor is exposed, the isolating double layer in this area in section having a re-entrant profile. The organic active semiconductor material is now provided in the form of a layer over the isolating double layer where this has not been removed and in the exposed portion thereof, such that the semiconductor material contacts both the source and the drain electrodes of the organic transistor and simultaneously also registers with the gate electrode of organic transistor. The broken re-entrant profile and the isolating double layer provide a secure electrical isolation between the organic transistor and the inorganic transistor. Of course, the active organic semiconductor material optionally may be removed where it covers the isolating double layer. In FIG. 2a it is, however, retained.

It is to be understood that the active inorganic semiconductor material is not restricted to a hydrogenated amorphous silicon, but may well consist of hydrogenated microcrystalline or polycrystalline silicon. The source and drain material may also be deposited separately and be different from the channel area, e.g. $n^+$ doped microcrystalline hydrogenated silicon. Correspondingly the organic active semiconductor material in the organic transistor is not restricted to pentacene, but may generally be made of polyconjugated organic compounds with suitable properties and be formed by several such. As example of such polyconjugated organic compounds and as known in the art, it may be mentioned conjugated oligomers, the units of which includes or consists of phenylene groups which may be substituted, ortho-fused or ortho- and peri-fused aromatic polycyclic hydrocarbons with 4 to 20 fused rings, polyenes with the formula H—C($T_1$)=C($T_2$)—H where $T_1$ and $T_2$ independently represent —H or a lower alkyl and r is an integer which may vary from 8 to 50, as well as conjugated oligomers whose repeating units contain at least a five-link heterocycle. Generally shall a polyconjugated compound used as active semiconductor material in the organic semiconductor transistor contain at least 8 conjugated bonds and have a molecular weight which is not greater than about 2000. For a more comprehensive discussion of these materials it shall besides be referred to the above-mentioned U.S. Pat. No. 5,347,144 (Garnier & al.).

Figure 2B:
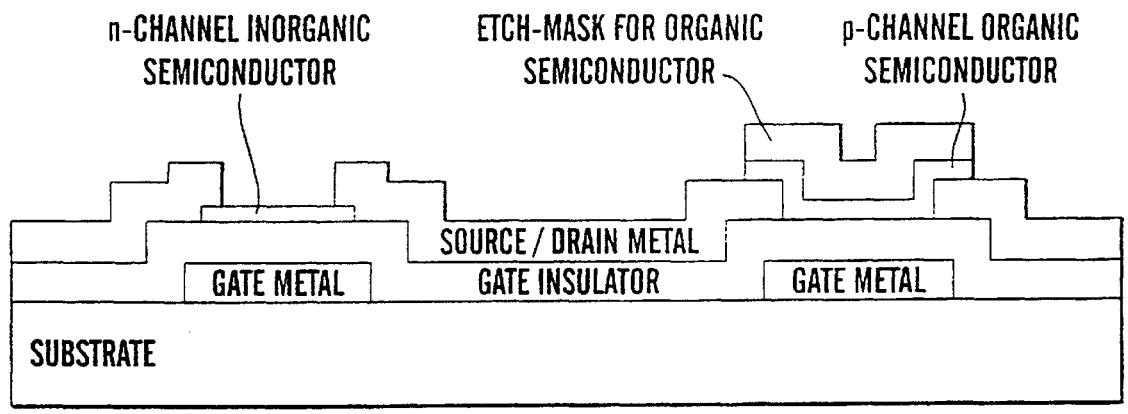
Figure 2C:
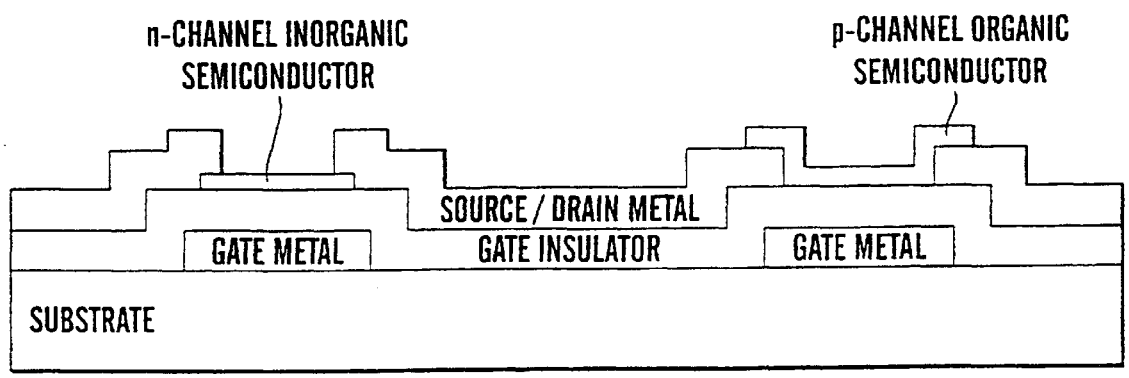

As an alternative to the embodiment in FIG. 2a, the isolation of the active semiconductor material in the p-channel transistor may be achieved with a simplified version of the complementary thin-film transistor circuit. In FIG. 2b this is shown by providing a photoresist layer over the complementary thin-film transistor circuit, whereafter the organic active semiconductor material is removed outside the organic thin-film transistor. The mask layer of the photoresist may be retained as shown in FIG. 2b, but it may also be removed such this is shown in FIG. 2b. In each case the active semiconductor material in the organic transistor becomes electrically isolated against the inorganic transistor. In that connection it shall be remarked that generally it has been regarded as a problem to remove active organic semiconductor material by etching, as such materials usually are damaged or destroyed when they are subjected to common photoresists and chemicals for treatment of the photoresist. However, it has turned out that a water-based etch process with water-based material provides very good results. In the patterning of e.g. organic optoelectronic material may e.g. polyvinyl alcohol as solvent and gelatine as photoresist be an advantageous alternative. Besides are both photolithography and printing other possible alternatives to etching—particularly printing may in the long run turn out to be both the simplest and cheapest.

Figure 3A:
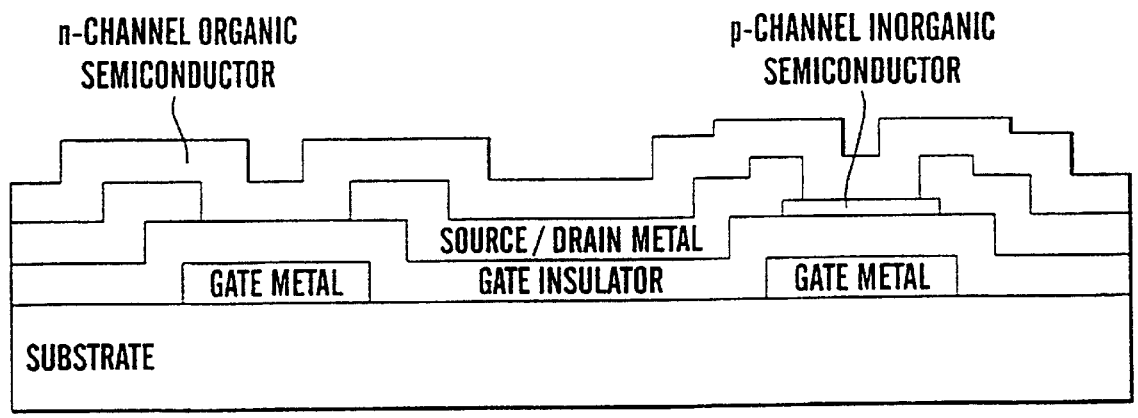

FIG. 3a shows a section through an organic/inorganic thin-film transistor according to the present invention where an organic thin-film transistor with an n-channel organic semiconductor is employed. FIG. 3 shows the simplest embodiment possible, wherein separate gate electrodes are provided on the substrate, the gate isolator consists of the same material in both cases and the metal for the source/drain electrode similarly is the same for both transistors.

As an example of an organic n-channel material may be mentioned copper hexadecafluorophtalocyanine ($F_{16}$CuPc) (see Y. Y. Lin & al., "Organic complementary ringoscillators", Appl. Phys. Lett., Vol. 74 No. 18 (1999)). This organic semiconductor shows field-effect mobilities up to $10^{-2}$ cm/Vs and is not as sensitive to external conditions as other organic semiconductor materials of the n-type such as buckminsterfullerene ($C_{60}$).

Organic n-channel thin-film transistors based on copper-hexadecafluorophtalocyanine ($F_{16}$CuPc) or another organic semiconductor material of the n-type may be combined with one of several inorganic p-channel semiconductor materials in order to form the complementary thin-film transistor circuit.

As examples of suitable inorganic semiconductors of the p-type may be mentioned p-channel amorphous silicon which has field effect mobilities comparable with $F_{16}$CuPc, or copper-doped polycrystalline germanium (pc-Ge:Cu) which in the literature is shown used in combination with indium-doped cadmium selenide (Cd-Se:In) in a complementary polycrystalline thin-film technology (see J. Doutreloigne & al., "The electrical performance of a complementary CdSe:In/Ge:Cu thin film transistor technology for flat panel displays", Solid-State Electronics, Vol. 34 No. 2 (1991)). Polycrystalline germanium has displayed field-effect mobilities of about 5–15 cm²/Vs, but requires a more complicated processing than amorphous silicon.

Figure 3B:
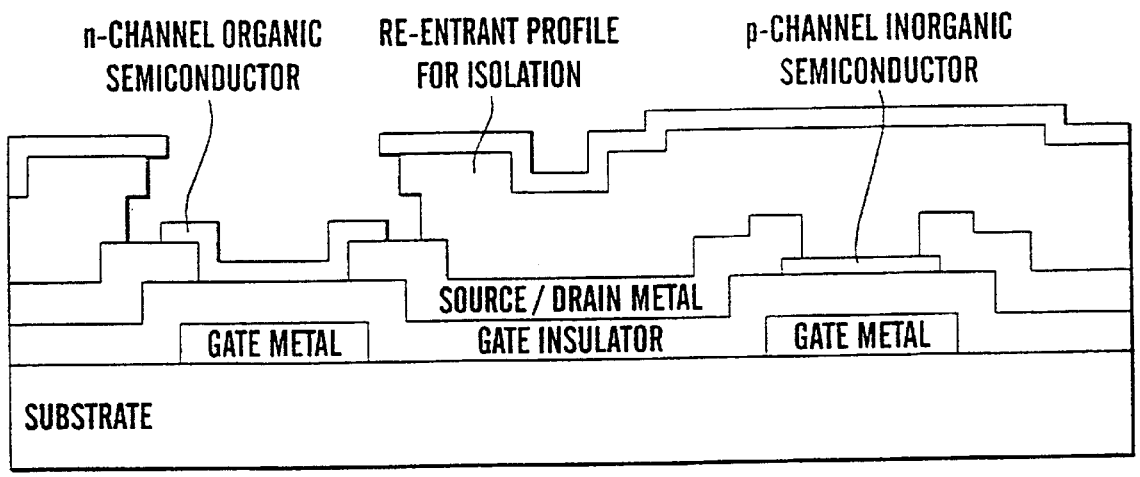
Figure 3C:
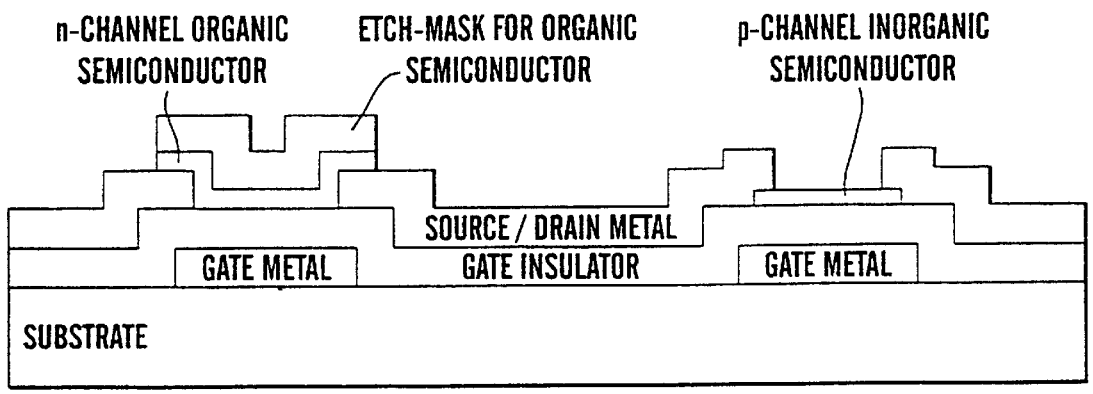
Figure 4A:
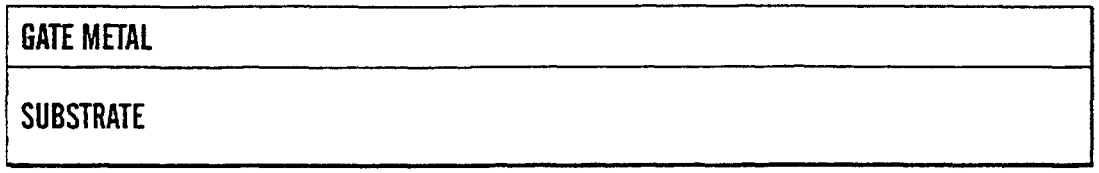

FIG. 3b shows an embodiment of the complementary thin-film transistor circuit according to the invention with an n-channel transistor. The embodiment in FIG. 3b is analog to that in FIG. 2a, but with the same metal used for the source and drain electrodes in both transistors. The isolating double layer may be realized as in FIG. 2a, namely consisting of polymethylmetacrylate and Novolac photoresist such that the portion above the n-channel organic semiconductor is exposed, the isolating double layer also here being broken by a re-entrant profile. The active semiconductor in the n-channel organic transistor will then be isolated from the p-channel inorganic transistor, something which may be advantageous, but which is not a necessary conditions for using an organic active n-channel semiconductor material.

Figure 3D:
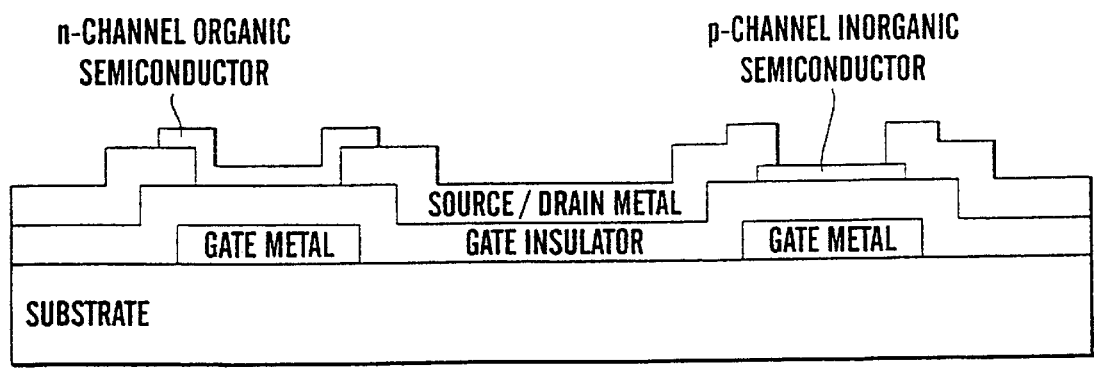

The isolation of the organic active n-channel semiconductor material may also be achieved in corresponding manner as shown for the embodiment in FIG. 2b, namely as shown in FIG. 3c, where a photoresist is etched and masked such that the n-channel organic active semiconductor is isolated. The etch mask, i.e. the photoresist, may also here be removed from the organic n-channel transistor and it is then obtained the variant which is shown in FIG. 3d of the embodiment in FIG. 3c.

There shall now with reference to FIGS. 4a–4r which schematically show the process scheme for integrated complementary a-Si:H organic transistor technology be given a description of specific features in the fabrication of the complementary thin-film transistor circuit according to the invention. The inorganic a-Si:H thin-film transistor is made in a process which provides an inverted staggered three-layer structure, something which shall be described more closely in the following. The layers of a-Si:H/SiN were deposited using of plasma-enhanced chemical vapour deposition. The subsequent process step comprises standard lithographic methods and wet etching techniques as well as sputtered deposition of source and drain metal for the inorganic thin-film transistor. The source and drain electrodes of the organic thin-film transistor were deposited by means of thermal evaporation. In order to isolate the active semiconductor material of the organic thin-film transistor, in this case pentacene, a re-entrant photoresist profile was used consisting of polymethylmetacrylate (PMMA) and Novolac photoresist which together forms an isolating double layer in the complementary transistor circuit. This is a necessary step, as thin-film transistors with pentacene as p-channel active semiconductor material usually will have a positive threshold, i.e. a positive voltage must be used on the gate electrode to turn the transistor off. It is hence necessary to isolate an active p-channel semiconductor of pentacene in the organic transistor in order to prevent leakage in the pentacene layer, but as pentacene is sensitive to most forms of chemical processing, it is difficult to achieve isolation with the use of photolithography after the deposition of the organic semiconductive layer. With the method according to the invention the isolation is achieved during the deposition of the pentacene layer by breaking this over the re-entrant double-layer profile in the organic transistor. The maximum temperature which was used during the fabrication was 250° C.

Figure 4B:
Figure 4C:
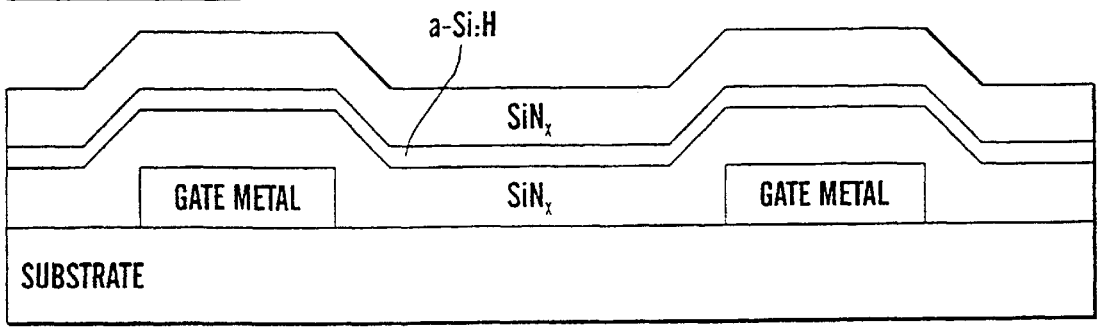
Figure 4D:
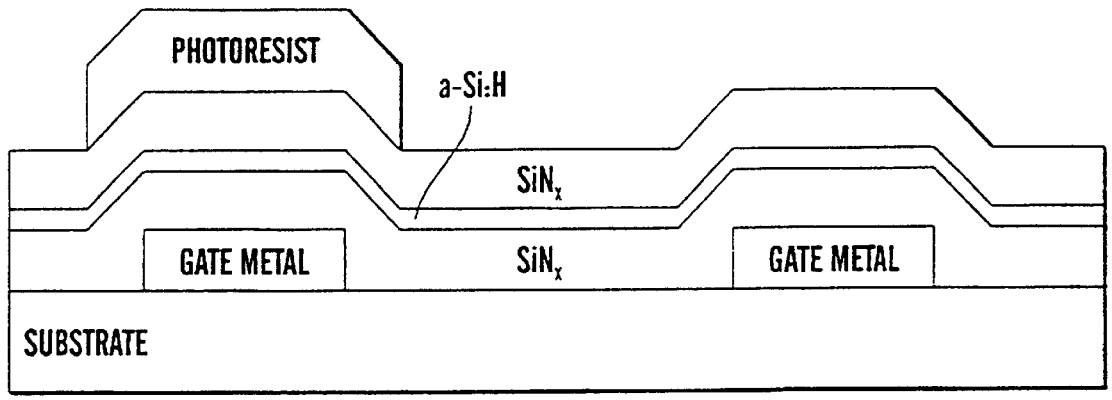
Figure 4E:
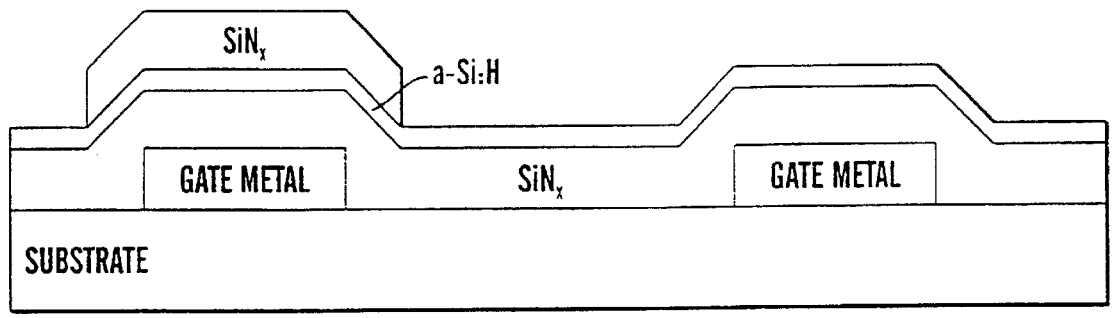
Figure 4F:
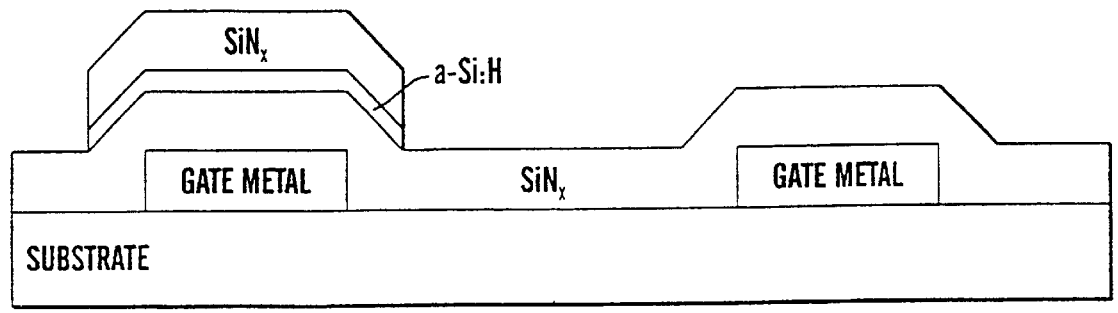
Figure 4G:
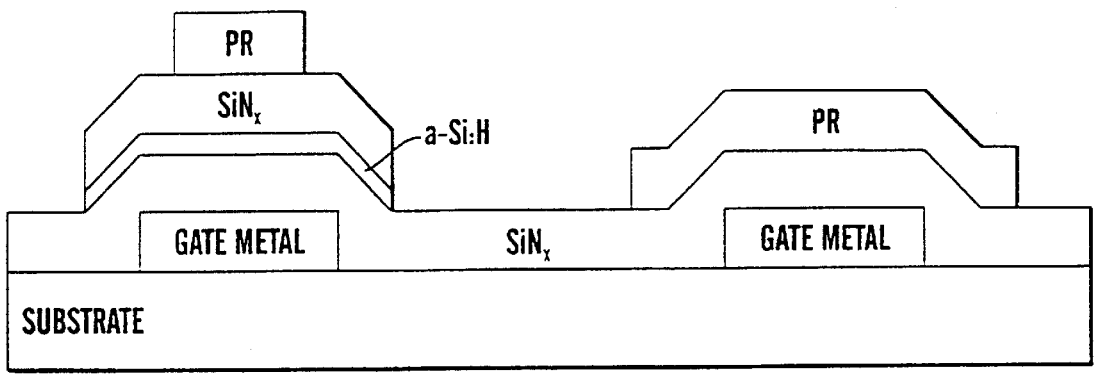
Figure 4H:
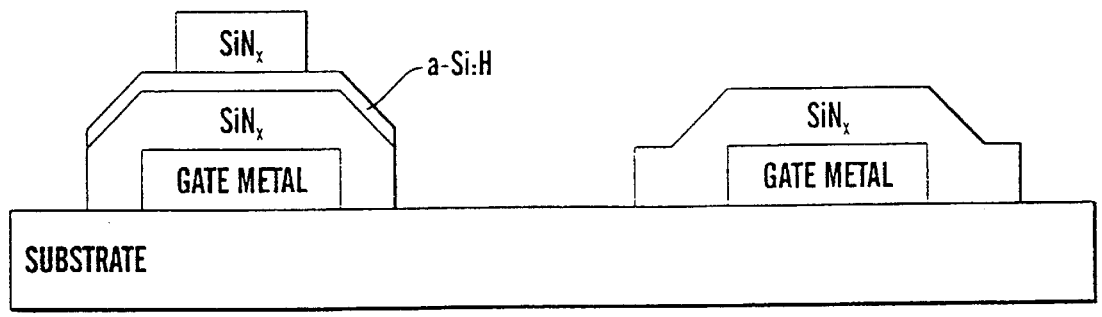
Figure 4I:
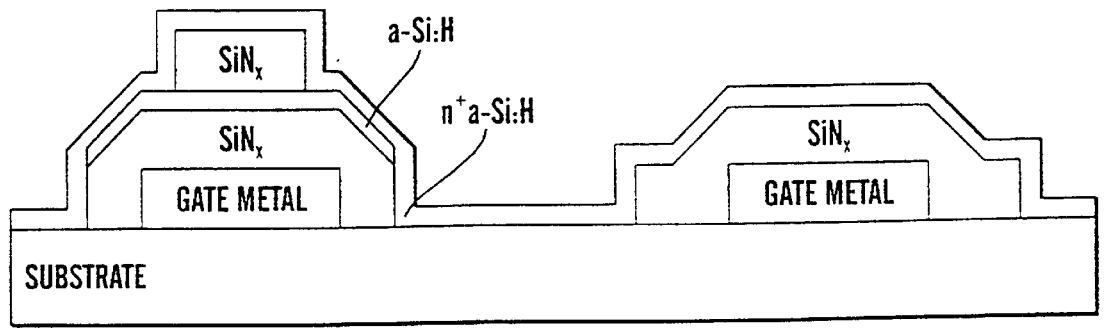
Figure 4J:
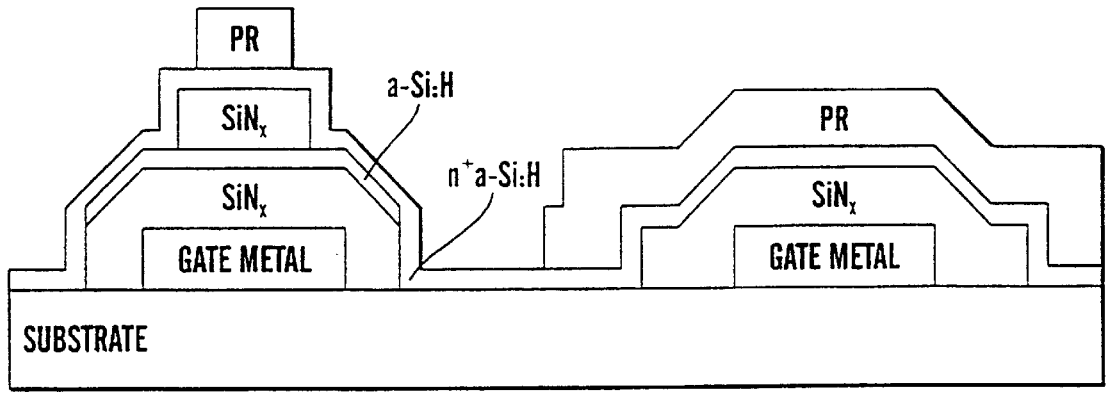
Figure 4K:
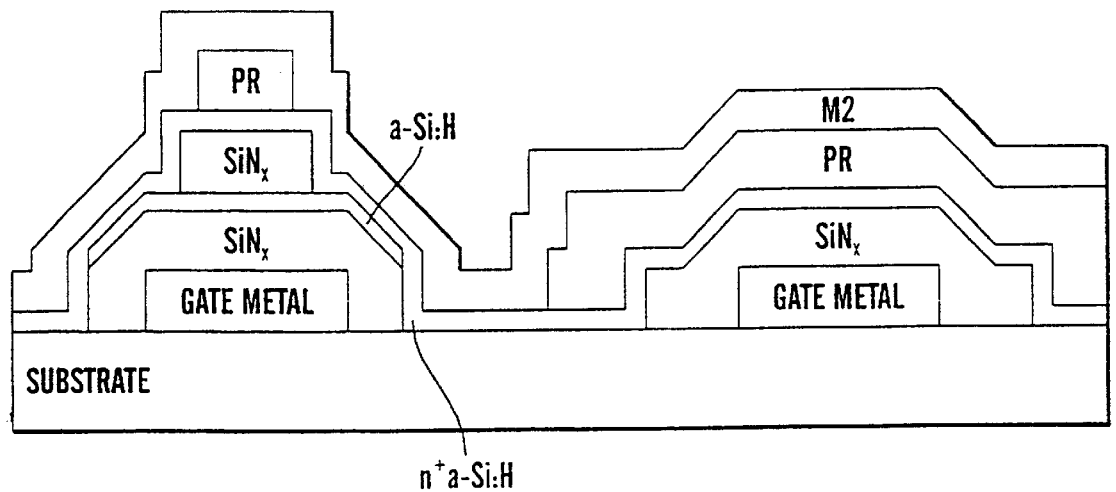
Figure 4L:
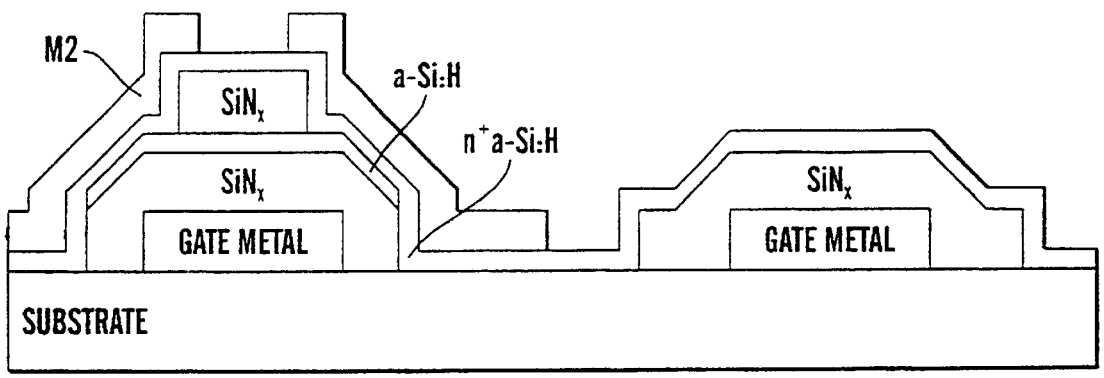
Figure 4M:
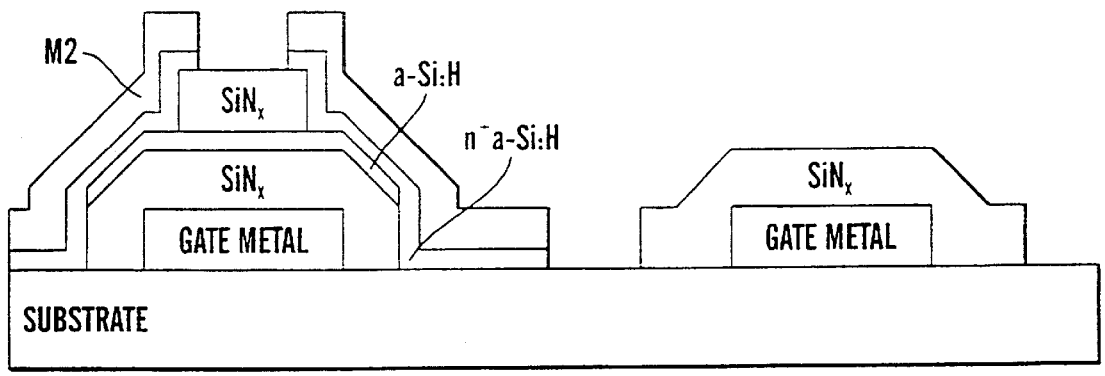
Figure 4N:
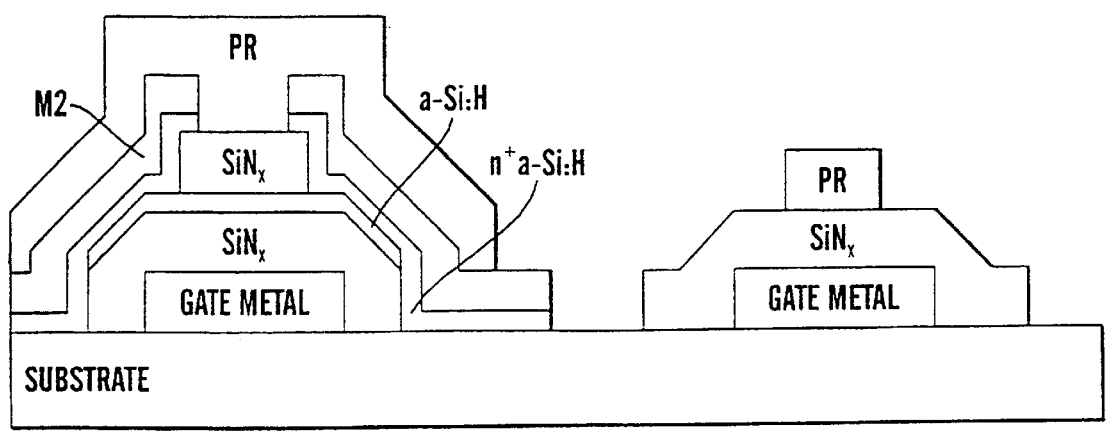
Figure 4O:
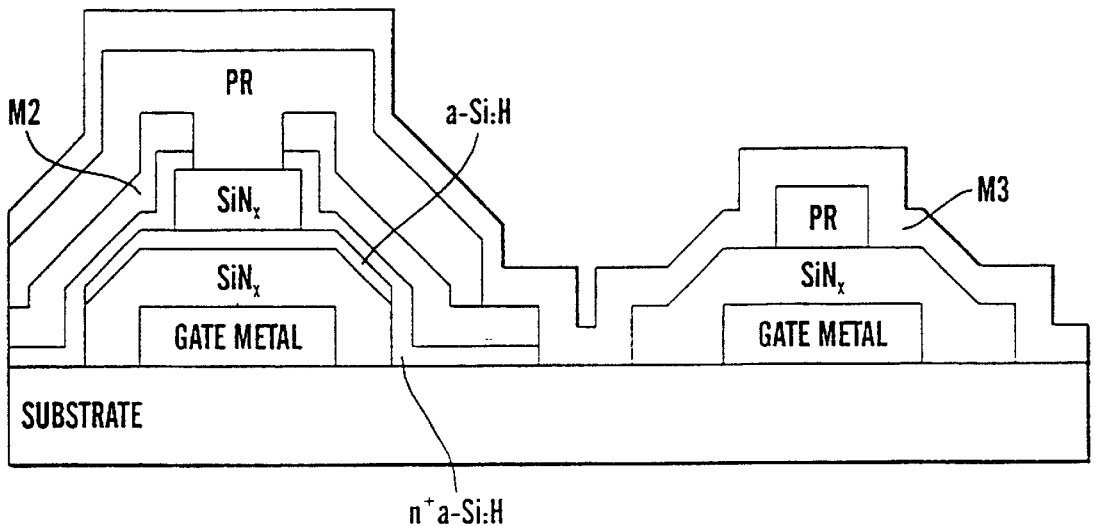
Figure 4P:
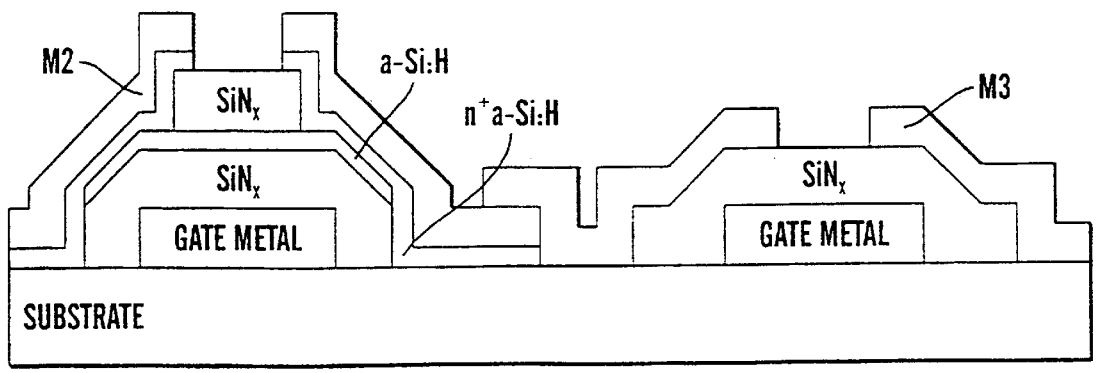
Figure 4Q:
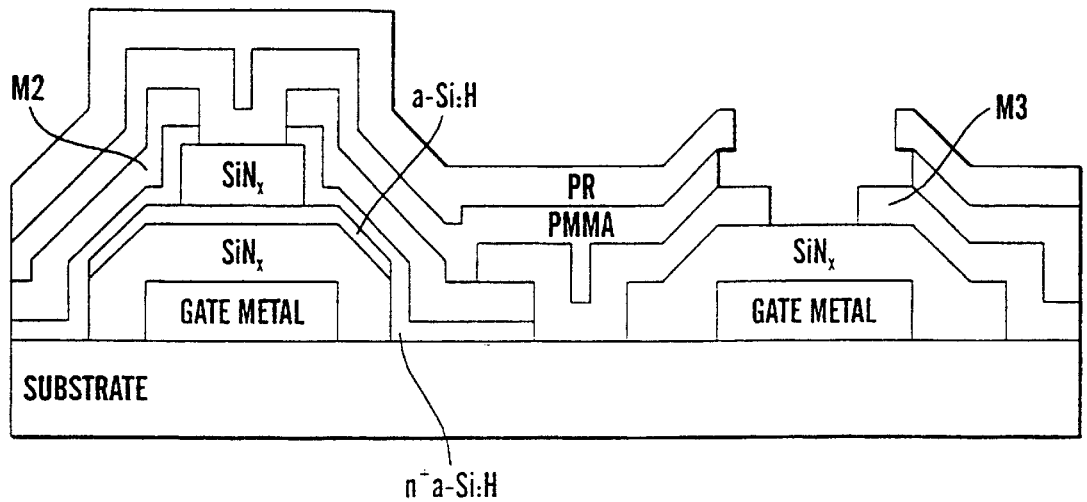
Figure 4R:
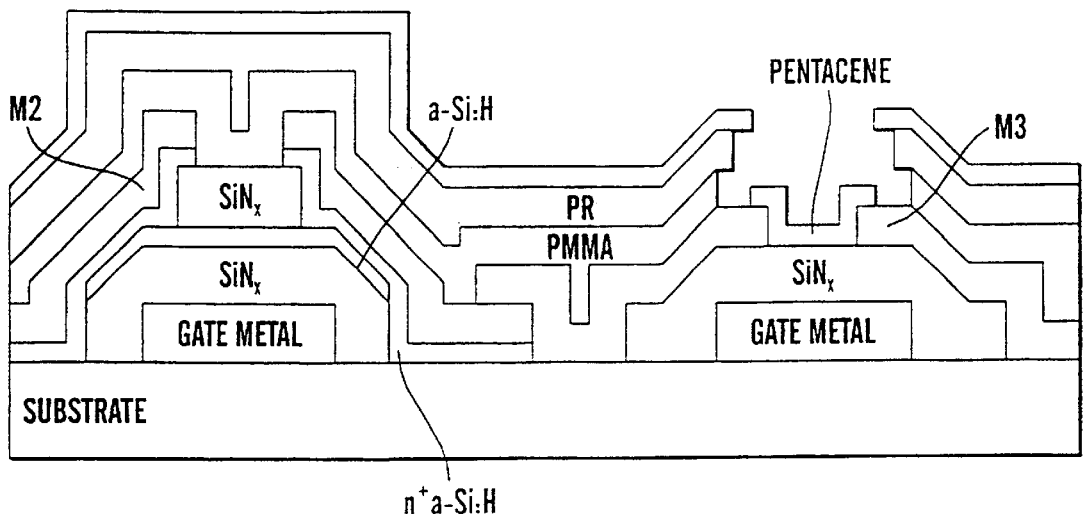

Now the process steps for the fabrication of a transistor of this kind shall explicitly be discussed with a concrete short reference to FIGS. 4a–4r which, however, substantially will be self-explanatory to a person skilled in the art. In FIG. 4a the gate electrode metal is deposited on the substrate by sputtering and then the separate gate electrodes are patterned with a first mask I as shown in FIG. 4b. By means of plasma-enhanced chemical vapour deposition, a tri-layer structure is thereafter deposited, consisting of a gate isolator $SiN_x$ over both gate electrodes, thereabove a layer of hydrogenated amorphous silicon and finally an isolation layer, once again formed of silicon nitride, such as shown in FIG. 4c. In the subsequent step shown in FIG. 4d a photoresist is now patterned with another mask II in order to actively define a thin-film transistor with hydrogenated amorphous silicon. In FIG. 4e the uppermost silicon nitride layer is etched and in the subsequent process step in FIG. 4f the layer of hydrogenated amorphous silicon is etched. In the process step shown in FIG. 4g a photoresist is patterned for etching of i-stopper and the lowermost nitride layer by means of a third mask III. The etching itself of the i-stopper and the lowermost silicon nitride layer is shown in FIG. 4h.

In order to realize the source and drain areas of the n-channel transistor as shown in FIG. 4i $n^+$ a-Si:H is now deposited by means of plasma-enhanced chemical vapour deposition and in the subsequent process step in FIG. 4j this takes place by means of a fourth mask IV for patterning a photoresist for lift-off of source/drain electrode metal. This is sputtered in the process step as shown in FIG. 4k and is denoted with M2 which may be a metal different from the first metal used in the gate electrodes. In the process step shown in FIG. 4l the source/drain metal M2 for the organic transistor was lifted off and then follows in the process step shown in FIG. 4m an etching of the $n^+$ layer of hydrogenated amorphous silicon which hence shall provide the source and drain areas of the inorganic transistor.

Now follows in the process step shown in FIG. 4n a patterning of a photoresist for lift-off of the metallization of the organic thin-film transistor. This takes place by means of a fifth mask V. A metal layer of a third metal M3 is now deposited over the whole transistor circuit, as shown in FIG. 4o, and then follows the lift-off of this metal layer M3, such that the organic thin-film transistor appears with source and drain electrodes of the metal M3 provided in the same level in the thin-film structure. In order to isolate the organic thin-film transistor electrically against the inorganic thin-film transistor is now by means of photo-lithography deposited a double layer consisting of polymethylmetacrylate PMMA and for instance Novolac photoresist. The isolating double layer is patterned such that the source and drain electrodes of the metal M3 for the organic thin-film transistor are exposed between re-entrant broken profiles of the isolating double layer, such this is shown in FIG. 4q. Finally is now the organic active semiconductor material deposited in the form of pentacene over the whole circuit and provides in the exposed portion the active p-channel semiconductor material of the organic transistor. It shall be understood that the pentacene layer where it covers the isolating double layer besides may be removed therefrom in a concluding not shown process step. Further may, of course, electrically isolating passivation and planarization layers be deposited over the whole complementary thin-film circuit, such this is known in the art, but not here specifically shown. The complementary organic thin-film transistor circuit according to the invention now appears substantially as shown in FIG. 4r and corresponding to the embodiment shown in FIG. 2a.

Figure 5A:
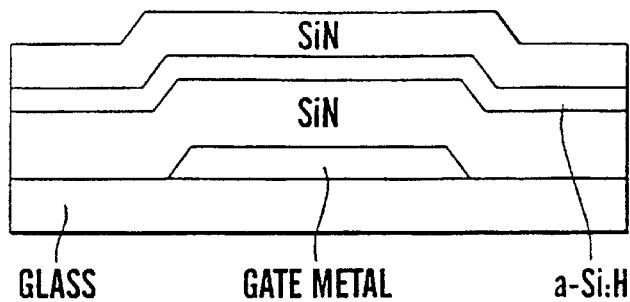
Figure 5B:
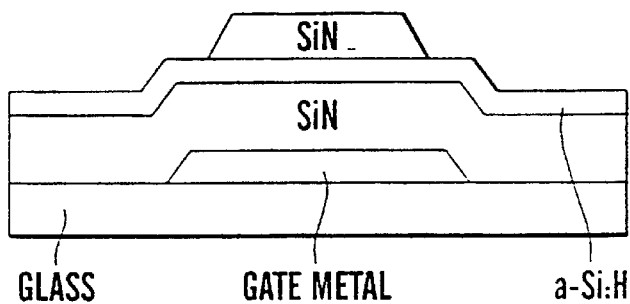
Figure 5C:
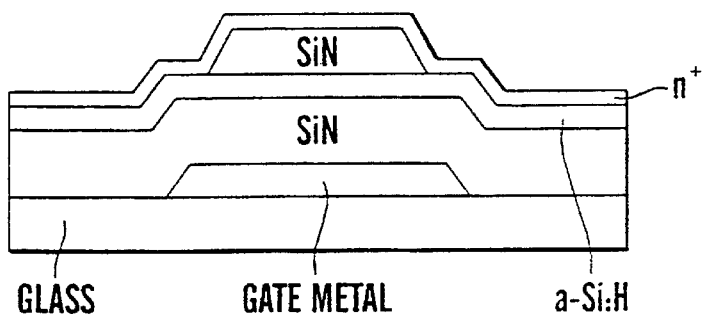
Figure 5D:
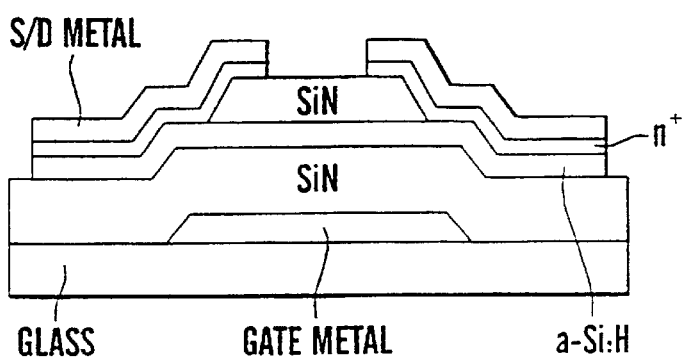

The tri-layer etch process as used with the present invention and as rendered in the process steps as shown in FIGS. 4c–h shall now be discussed in somewhat greater detail with reference to FIGS. 5a–5d. In the tri-layer etch process as shown in FIG. 5a, a triple layer of silicon nitride, undoped hydrogenated amorphous silicon and a further layer of silicon nitride are deposited on the patterned gate electrode. The uppermost silicon nitride layer is patterned as shown in FIG. 5b and an $n^+$ doped layer of amorphous hydrogenated silicon is deposited all over as shown in FIG. 5c. The metal of the source and drain electrodes is patterned and the doped amorphous silicon material over the uppermost silicon nitride layer etched away, as shown in FIG. 5d. As the uppermost silicon nitride layer protects the channel area in the inorganic thin-film transistor, this etch step is not critical. However, the tri-layer process requires two deposition steps of amorphous silicon and as the source and drain electrodes must be patterned on the top of the uppermost silicon nitride layer which is patterned with the channel length, this requires a more aggressive photolithography for a given channel length.

Figure 6A:
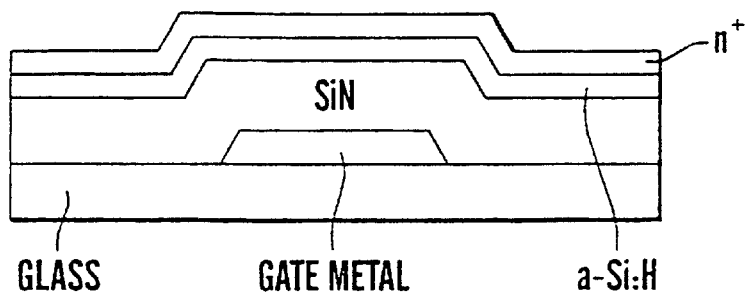
Figure 6B:
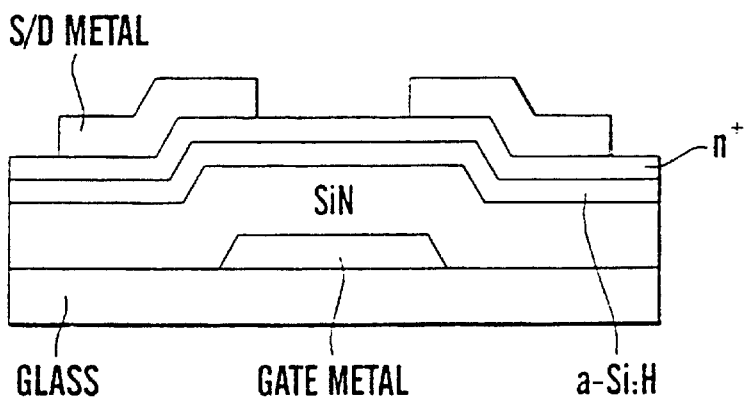
Figure 6C:
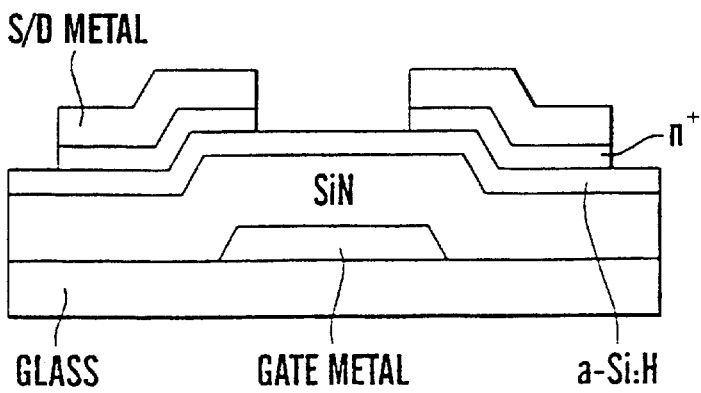
Figure 7A:
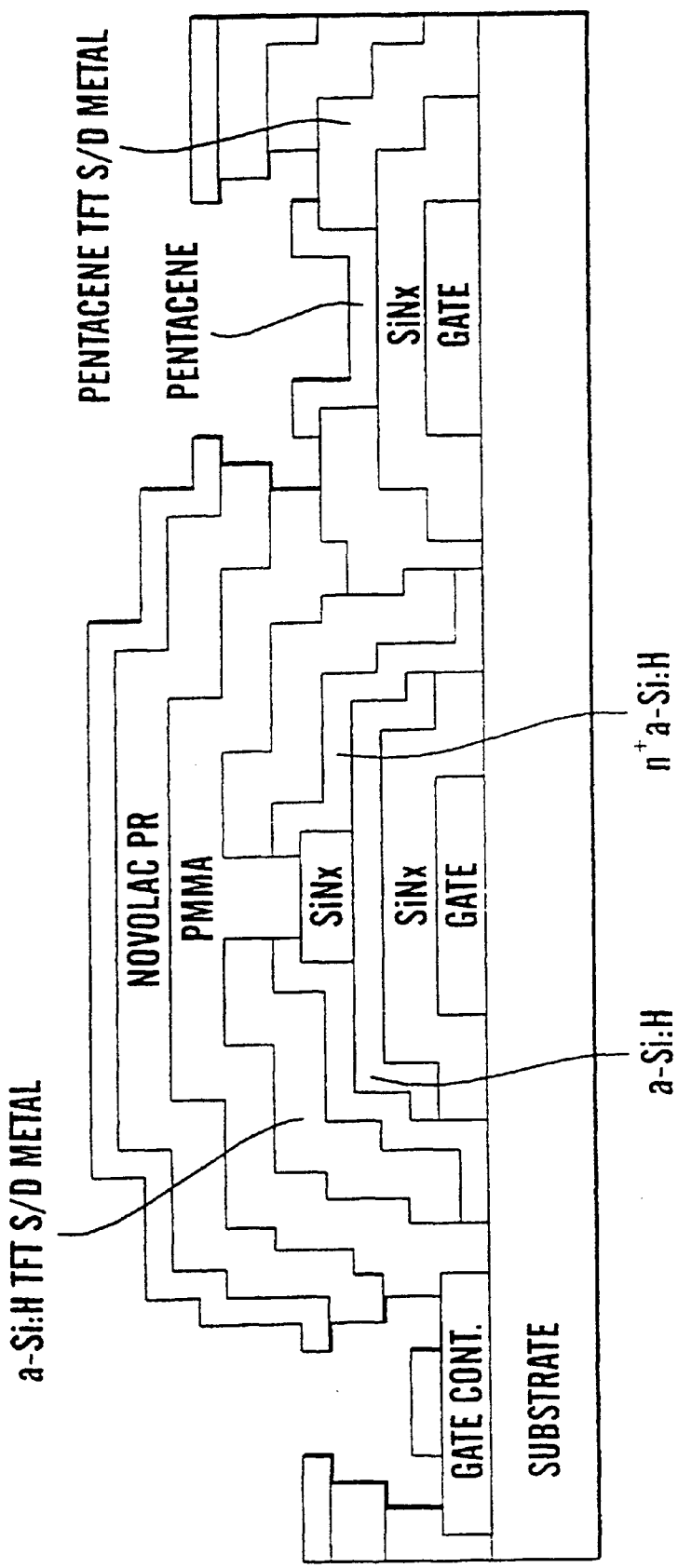
Figure 7B:
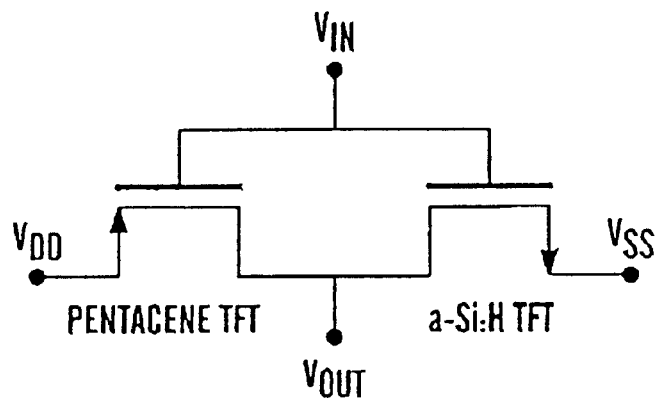

The back-channel etch process is shown in FIGS. 6a–6c. An isolation layer of silicon nitride is deposited over the gate electrode and the substrate, and followed by undoped hydrogenated silicon and $n^+$ doped silicon as well as a further layer of $n^+$ doped hydrogenated amorphous silicon. This is shown in FIG. 6a. The source and drain electrodes are patterned and the doped hydrogenated amorphous silicon in the channel area is etched away, such this is shown in FIG. 6b and FIG. 6c respectively. The back-channel etch process is very simple, but the etching of the $n^+$ doped hydrogenated amorphous silicon in the channel area is a critical step. Typically back-channel etching results in inorganic thin-film transistors with poorer quality than that may be obtained by using a three-layer etch process.

FIG. 7a shows a schematic section through an inverter formed with the integrated complementary thin-film transistor circuit according to the invention. Functionally the inverter in FIG. 7a corresponds substantially to the complementary transistor circuit according to prior art as rendered in FIG. 1, but is based on the embodiment according to the present invention such this for instance is shown in FIG. 2a. As therein the organic transistor of the inverter is based on a p-channel semiconductor material, viz. pentacene, and hydrogenated amorphous silicon in doped and undoped form is used as the semiconductor material in the inorganic transistor. As the input signal to the inverter shall be conveyed to the gate electrodes, there is for this purpose provided a gate electrode contact as shown to left in FIG. 7a. This gate electrode contact may then be deposited in the same process step as shown in FIGS. 4a–4b with the use of mask I. As in FIG. 2a the isolating double layer of polymethylmetacrylate on Novolac photoresist will isolate both the organic transistor as well as the inverter gate contact against the inorganic transistor. Besides may also here the pentacene layer which is provided over the isolating double layer as well as over the gate electrode contact of the inverter, be removed. The well-known schematic circuit diagram of the inverter shown in FIG. 7b and an inverter realized with use of a complementary transistor circuit and a method according to the invention is shown by the line drawing in FIG. 7c. The organic thin-film transistor is here located at left and the inorganic thin-film transistor in the complementary thin-film transistor circuit at right in FIG. 7c.

Figure 8A:
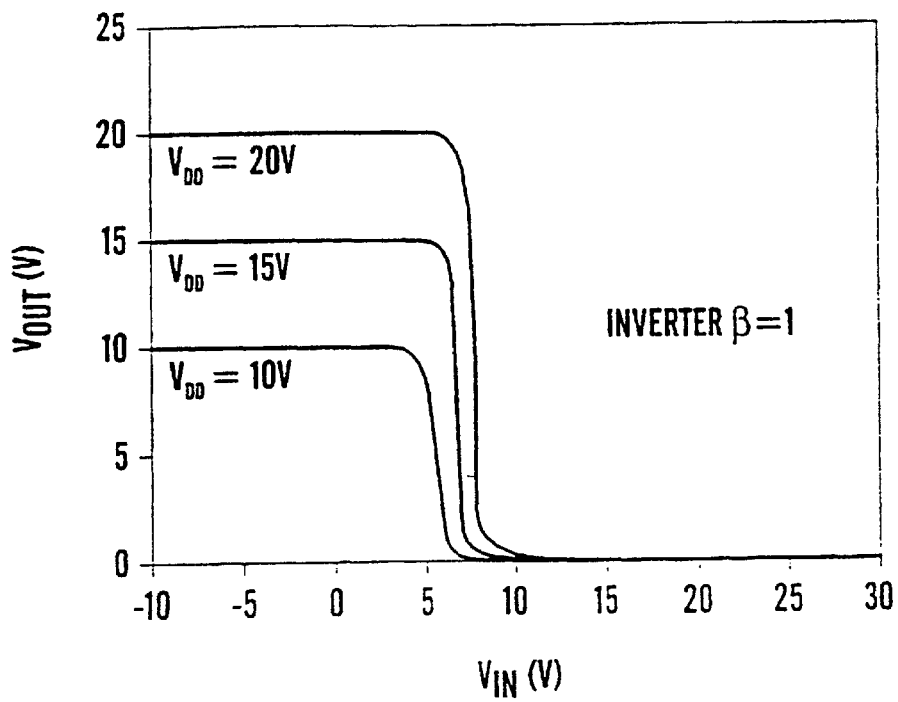

FIG. 8a shows the voltage transfer curves for different supply voltages for an inverter with a β ratio of 1. The β ratio is here defined by $$\beta = \frac{(W/L)_{a-Si:H}}{W/L_{pentacene}}$$

Figure 8B:
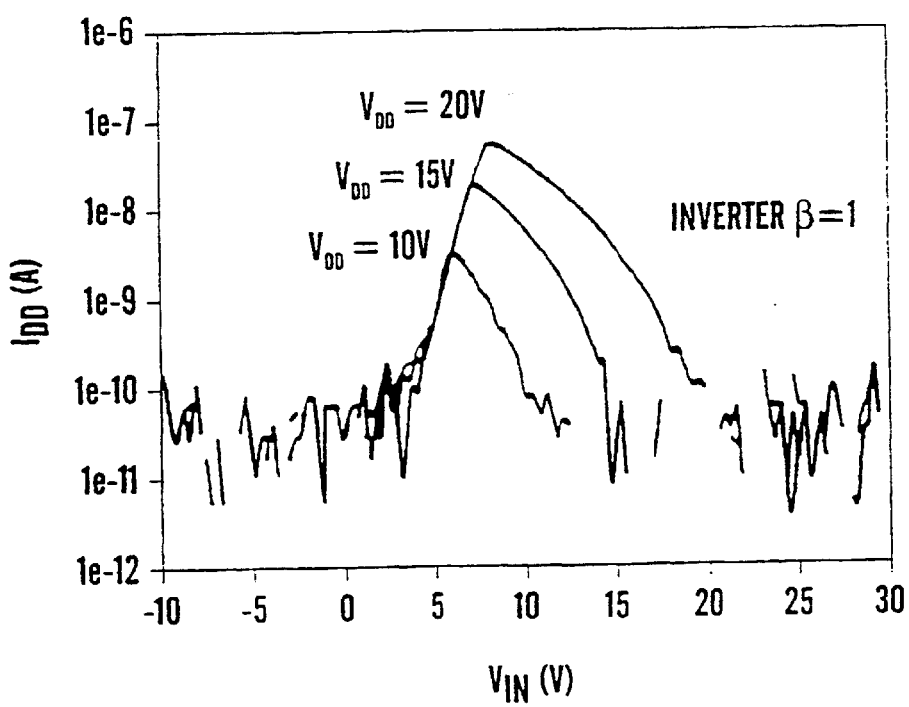

In this regard it shall be remarked that in CMOS circuits both transistors may be operated both as driver and load. Due to a topological similarity β is sometimes defined as the width/length relationship W/L for the n-channel device divided by the length/width relationship for the p-channel device.—The inverter shows sharp transitions with a gain which exceeds 22 for a supply voltage of 20 V. The on voltage of the inverter is equal to the supply voltage and the off voltage is 0 V. This shows the complete maintenance of the voltage levels of the complementary thin-film transistor circuit according to the invention. The transition current for the inverter reaches a top near the logic transition voltage and is otherwise very low, such this is evident from FIG. 8b. This shows that the complementary thin-film transistor circuit according to the present invention has a true complementary behaviour.

Figure 7C:
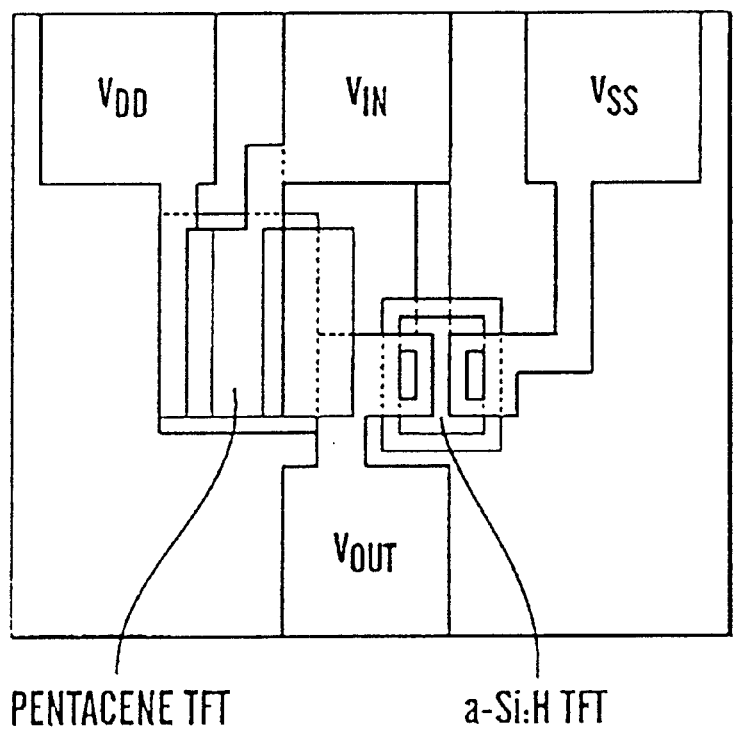
Figure 9A:
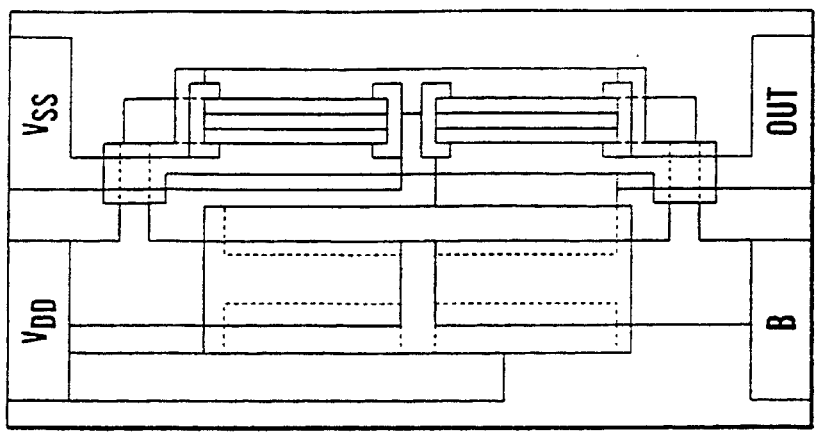
Figure 9B:
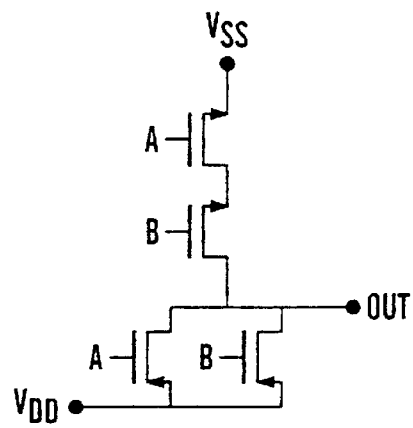
Figure 9C:
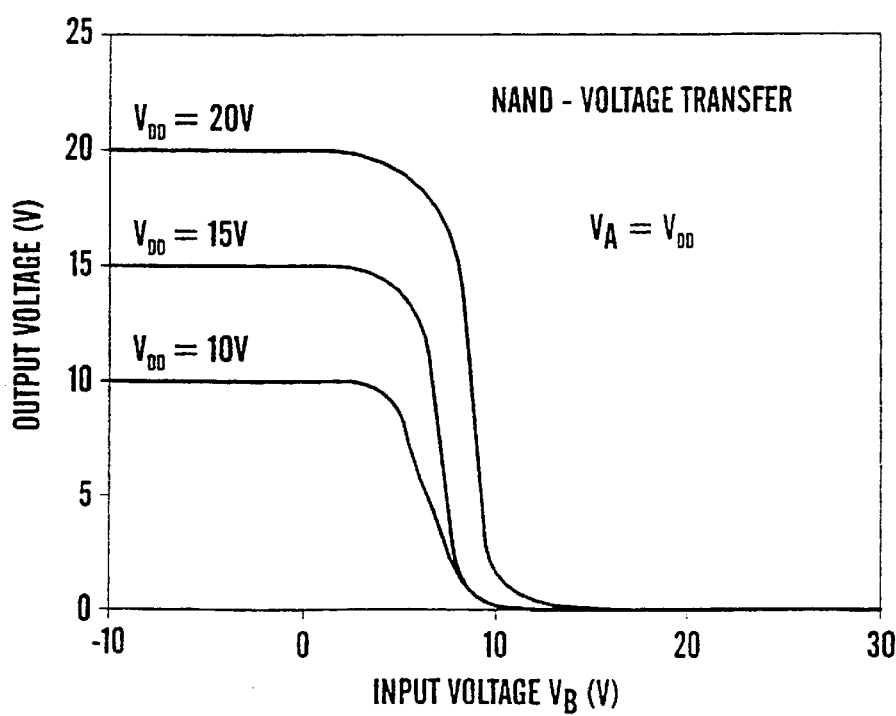

With the complementary thin-film transistor circuit according to the present invention it is, of course, possible to realize logic gates as otherwise well-known in the CMOS-technology. An example of a complementary NAND-gate realized by means of a complementary transistor circuit according to the present invention is shown in the line drawing in FIG. 9a and the corresponding schematic circuit diagram in FIG. 9b. By connecting the output of the NAND gate to the inverter shown in FIG. 7c a complementary AND gate is of course obtained, the output of which then becoming the inverted of the output signal from the NAND gate. The voltage transfer curve for different input voltages for the NAND gate is shown in FIG. 9c and has the same properties as the voltage transfer curves for the simple inverter such these are shown in FIG. 8a. A person skilled in the art will, of course, realize that generally may all logic gates as known in the CMOS technology and the corresponding Boolean functions be realized with the use of a NAND gate as shown in FIG. 9a and inverters as shown in FIG. 7c. The integrated complementary thin-film transistor circuit according to the invention is generally used for realizing logic gates in complementary thin-film technology.

By means of the integrated complementary thin-film circuits ring oscillators were made with respectively 5 and 11 inverter stages and with different β ratios. These ring oscillators show a single gate delay as low as 5 μs, a gate power dissipation less than 0.2 μW per stage and a power delay product as low as 15 pJ. The gate delay decreases fast with the increasing supply voltage, such that high operating frequencies may be obtained with the relatively low supply voltage.

Figure 10:
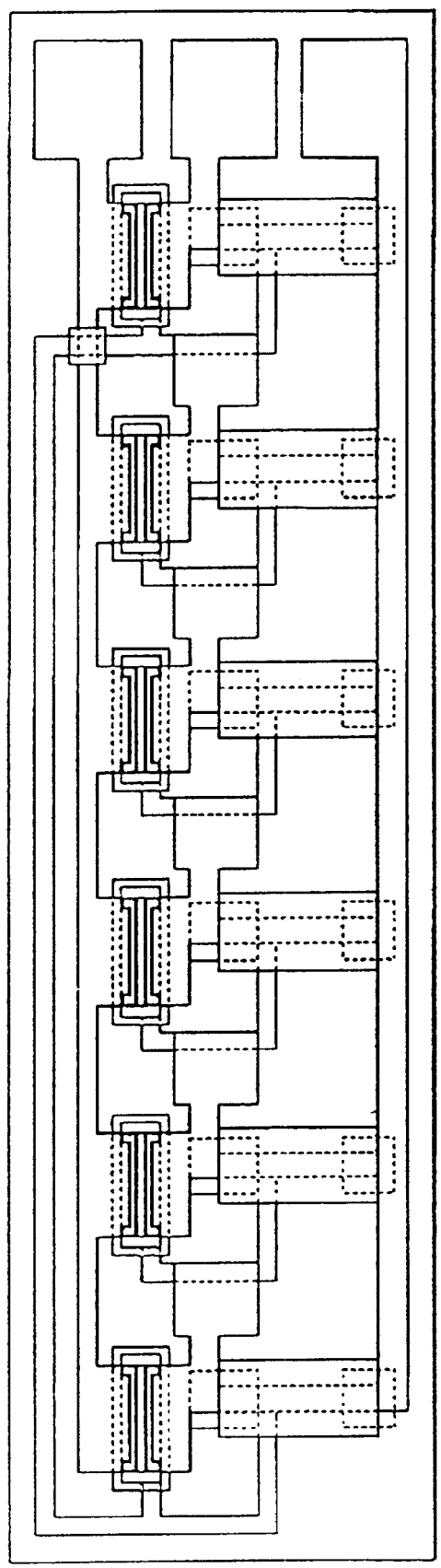
Figure 11:
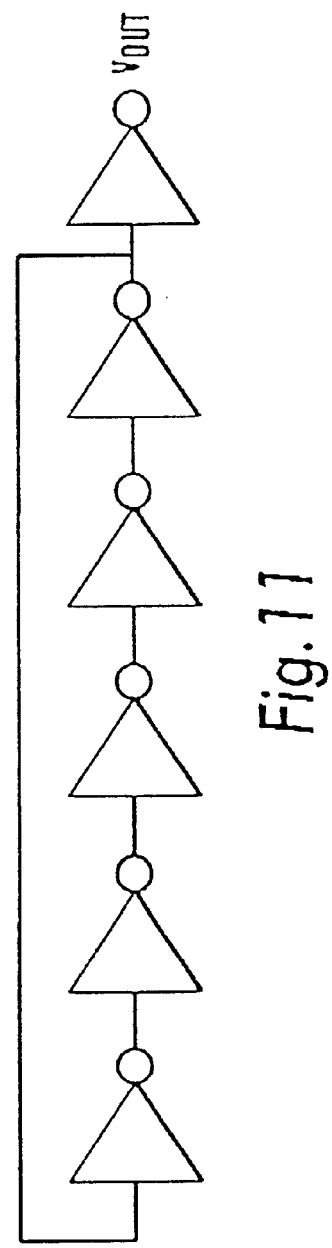
Figure 12A:
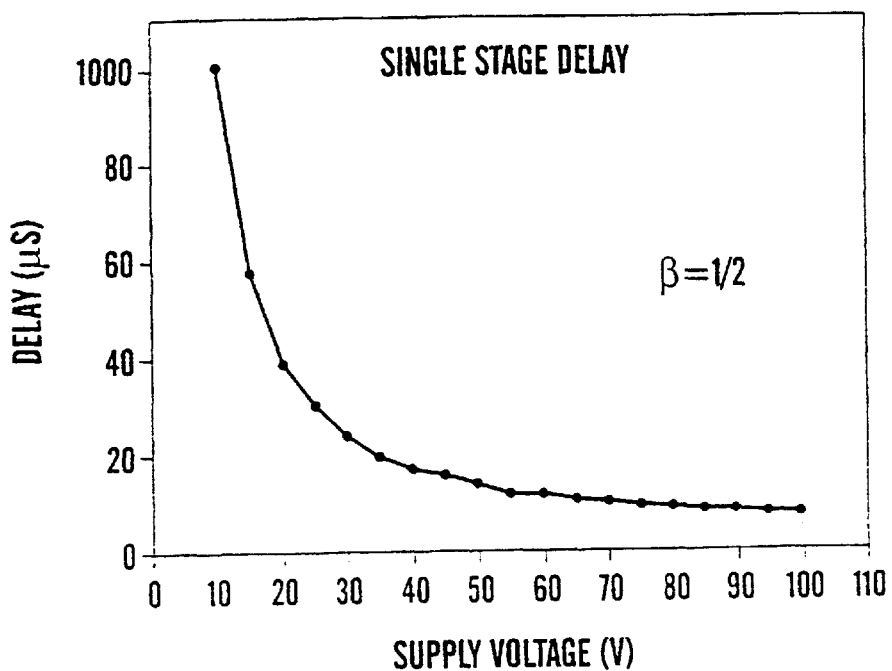

A line drawing of a five-stage ring oscillator is shown in FIG. 10 and with the circuit diagram rendered in FIG. 11. In addition to the five inverter stages an additional sixth inverter is used for isolating the circuit from the capacity load of an oscilloscope used for measuring the characteristics of the ring oscillator. From the measured oscillation frequency the delay of a single inverter stage can be derived. FIG. 12a shows the single gate delay for the shown five-stage ring oscillator, FIG. 12b power dissipation and FIG. 12c the power delay product for the same, all figures showing these characteristics for a β ratio of ½.

Figure 12B:
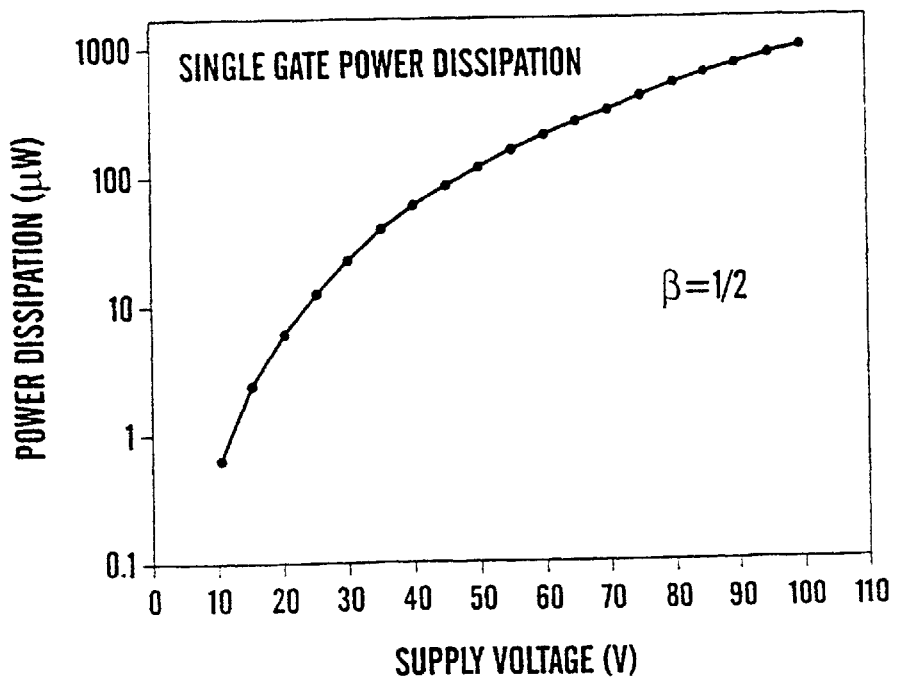
Figure 12C:
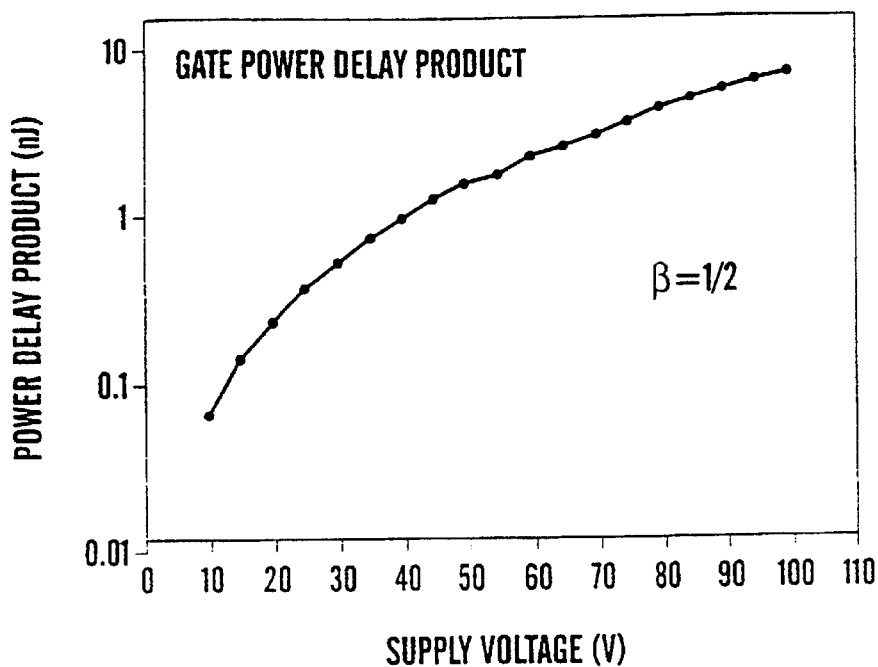
Figure 13A:
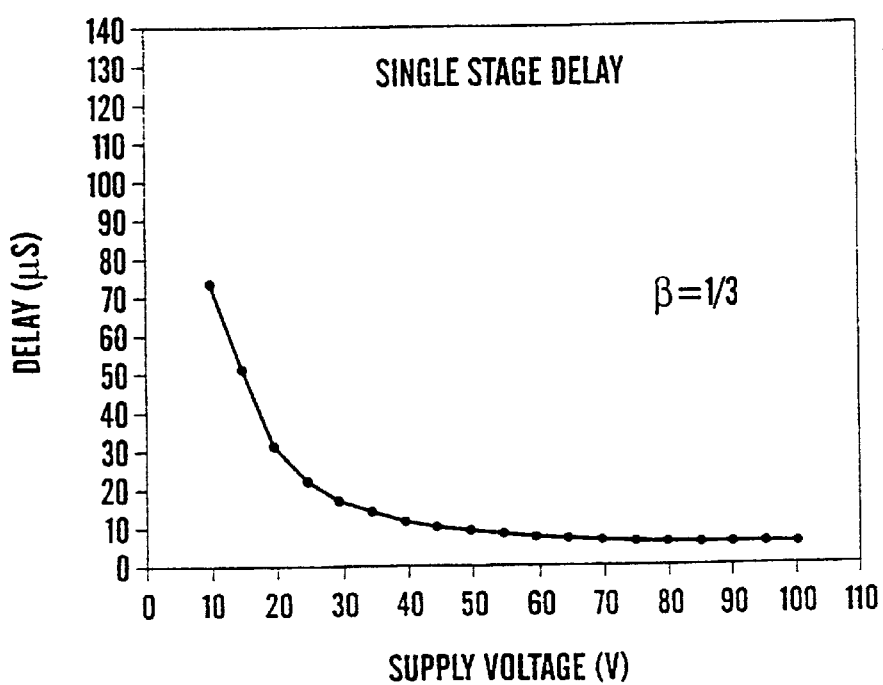
Figure 13B:
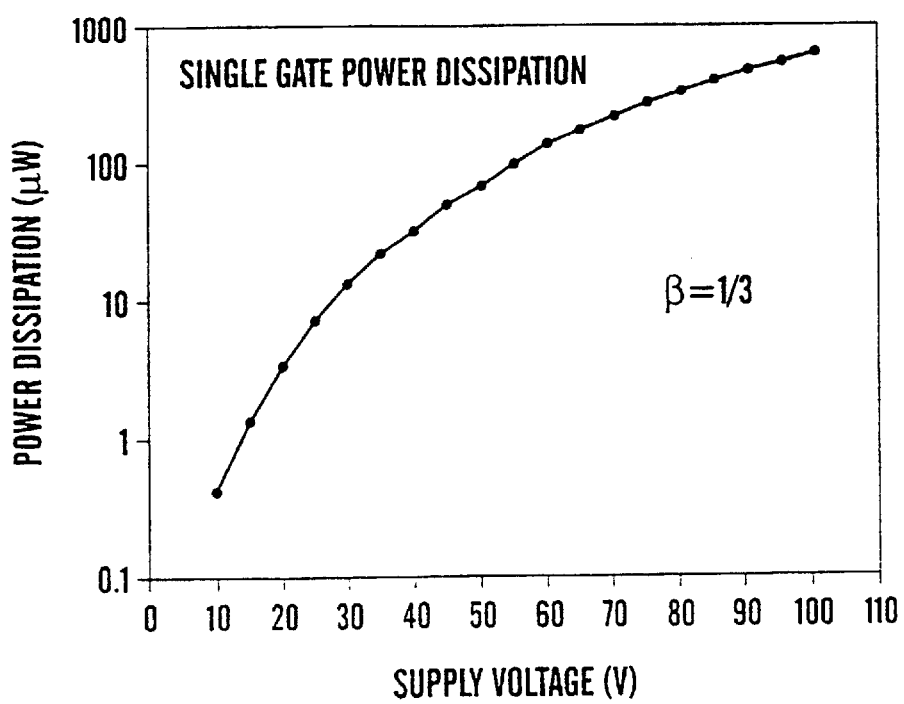
Figure 13C:
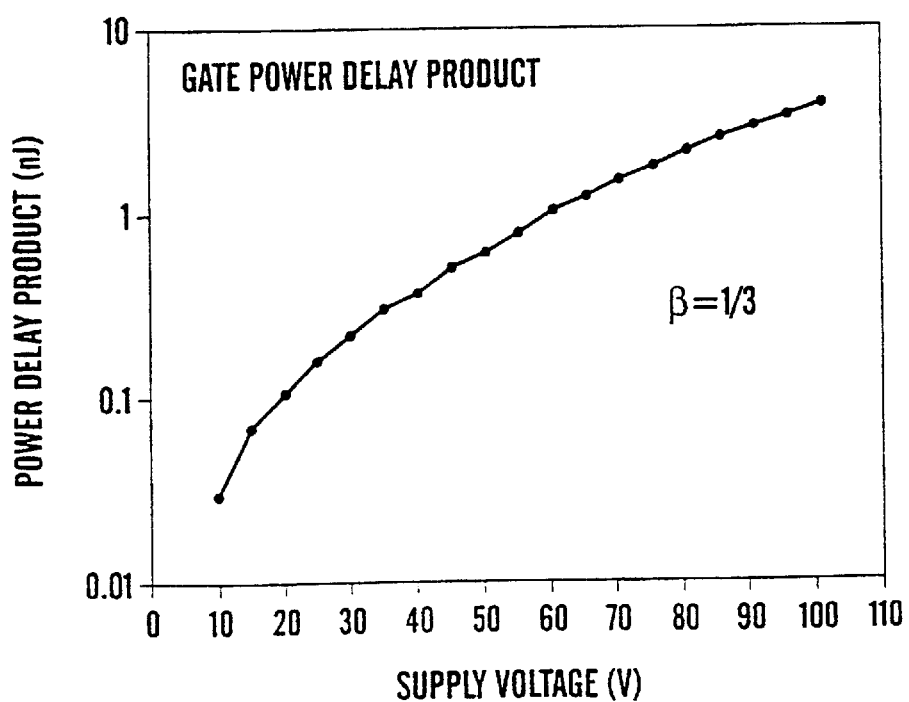

A ring oscillator with eleven inverter steps is realized in corresponding manner with the use of the integrated complementary thin-film circuit according to the present invention, but not shown herein. FIGS. 13a, 13b and 13c, however, show the corresponding characteristics for this eleven-stage ring oscillator as shown in FIGS. 12a–12c, but with a β ratio of ⅓.

The methods according to the present invention are simple and hence make it possible to fabricate integrated complementary thin-film transistor circuits according to the invention at low costs. Complementary transistor circuits have an inherent low static power consumption, something which is of importance for applications based on battery power. This makes the complementary thin-film transistor circuit according to the invention applicable in control circuits for liquid crystal displays in portable PCs, so-called "lap-tops" or for low-level implementation such as programmable tags. The circuits according to the invention have high switching amplification and very good maintenance of the logic level in addition to low static power consumption. The gate delay in the transistor circuits fabricated according to the invention measured by means of ring oscillators is as mentioned as low as 5 μs, the fastest speed up to now obtained with circuits which use organic transistors.

The hybrid integrated complementary thin-film technology, wherein the organic thin-film transistor may be an n-channel transistor and the organic transistor a p-channel transistor or vice versa, is of course, not restricted to use of the active semiconductor materials as mentioned in the exemplary embodiments. The on-going development of suitable organic as well as inorganic semiconductor materials makes it probable that in the future both n- as well as p-channel active organic semiconductor materials and correspondingly n- as well as p-channel inorganic active semiconductor materials with further improved properties may be employed. Composite inorganic semiconductor compounds may be of interest and the same applies to single crystal silicon, while on the other hand gallium arsenide for the time being appears less probable, but shall in no way be excluded in future hybrid complementary thin-film transistor circuits of the kind disclosed herein.

What is claimed is:
1. An integrated inorganic/organic complementary thin-film transistor circuit comprising:

a first and a second transistor which are operatively connected and provided on a common substrate, wherein the first transistor is an inorganic thin-film transistor, and wherein the complementary thin-film transistor circuit forms a multilayer thin-film structure, wherein the inorganic thin-film transistor is an n-channel transistor and the organic thin-film transistor is a p-channel transistor, or vice versa, the organic active transistor material in each case being respectively a p-channel organic semiconductor material or an n-channel organic semiconductor material, separate gate electrodes are provided for each of the transistors, the organic active semicondutor in an organic p-channel transistor in each case is provided electrically isolated from the inorganic n-channel transistor, and the organic active semiconductor in an organic n-channel transistor optionally is provided electrically isolated from the inorganic p-channel transistor.

2. A complementary thin-film transistor circuit according to claim 1, wherein the inorganic active semiconductor material is at least one of hydrogenated amorphous silicon (a-Si:H), hydrogenated or unhydrogenated microcrystalline silicon ($\mu$c-Si:H;$\mu$c-Si), hydrogenated or unhydrogenated polycrystalline silicon (pc-Si:H;pc-Si), single crystal silicon, copper-doped polycrystalline germanium (pc-Ge:Cu), cadmium selenide (CdSe), cadmium telluride (CdTe), and composite inorganic semiconductors based on said materials, possibly in single crystal form.

3. A complementary thin-film transistor circuit according to claim 2 wherein the inorganic transistor is an n-channel transistor, and wherein the inorganic active semiconductor material is hydrogenated amorphous silicon (a-Si:H).

4. A complementary thin-film transistor circuit according to claim 2, wherein the inorganic transistor is a p-channel transistor, and wherein the inorganic active semiconductor material is a p-channel silicon material, particularly p-channel hydrogenated amorphous silicon (a-Si:H).

5. A complementary thin-film transistor circuit according to claim 1, wherein the active semiconductor material in the organic thin-film transistor comprises at least one polyconjugated organic compound with a specific molecular weight.

6. A complementary thin-film transistor circuit according to claim 5, wherein the polyconjugated organic compound or compounds are at least one of conjugated oligomers, polycyclic aromatic hydrocarbons, particularly polyacenes, and polyenes.

7. A complementary thin-film transistor circuit according to claim 6, wherein the organic thin-film transistor is a p-channel transistor, wherein the organic semiconductor material is pentacene.

8. A complementary thin-film transistor circuit according to claim 1, wherein the organic thin-film transistor is an n-channel transistor, and wherein the organic active semiconductor material is copper hexadecafluorophtalocyanide ($F_{16}$CuPc).

9. A complementary thin-film transistor circuit according to claim 1, wherein the source electrode and the drain electrode of the organic thin-film transistor are provided in one and the same level in the thin-film structure of the organic thin-film transistor.

10. A method for fabricating an integrated inorganic/organic complementary thin-film transistor circuit comprising a first and a second transistor which are operatively connected and provided on a common substrate, wherein the first transistor is an inorganic thin-film transistor and the second transistor a organic thin-film transistor, and wherein the complementary thin-film transistor circuit forms a multilayer thin-film structure with successively deposited and patterned thin-film layers, the method comprising:

forming the inorganic thin-film transistor as an n-channel transistor and the organic thin-film transistor as a p-channel transistor by depositing respectively an n-channel inorganic active semiconductor material and a p-channel organic active semiconductor material or correspondingly forming the organic thin-film transistor as an n-channel transistor and the inorganic thin-film transistor as a p-channel transistor by depositing respectively an n-channel organic active semiconductor material and a p-channel inorganic active semiconductor material;

depositing separate gate electrodes for respectively the first and the second transistor on a common substrate;

depositing material for the source electrode and the drain electrode of the organic thin-film transistor on the same level in the thin-film structure of the organic thin-film transistor and in each case providing the organic active semiconductor material in an organic p-channel transistor electrically isolated from the inorganic n-channel transistor; and optionally providing the organic active semiconductive material in an organic n-channel transistor electrically isolated from the inorganic p-channel transistor.

11. A method for fabricating an inorganic/organic complementary thin-film transistor circuit comprising a first and a second transistor which are operatively connected and provided on a common substrate, wherein the first transistor is an inorganic thin-film transistor and the second transistor an organic thin-film transistor, wherein the complementary thin-film transistor circuit forms a multilayer thin-film structure with successively deposited and patterned thin-film layers, and wherein the method comprises;

depositing separate gate electrodes of a first metal for each of the two transistors on a common substrate;

depositing separate inorganic isolators of silicon nitride ($SiN_x$) over each gate electrode;

depositing an inorganic active semiconductor in the form of hydrogenated amorphous silicon (a-Si:H) above one of the gate electrodes which thus forms the gate electrode of the first transistor, depositing and patterning an n$^+$ doped layer of either hydrogenated amorphous silicon (n$^+$a-Si:H) or hydrogenated microcrystalline silicon (n$^+$ $\mu$c-Si:H) or hydrogenated polycrystalline silicon (n$^+$pc-Si:H) as source and drain contacts for the first transistor;

depositing and patterning the source and drain electrodes of the first transistor in form of a second metal over the source and drain contacts thereof;

depositing and patterning the source and drain electrodes for the second transistor in the form of a third metal in the same layer level in the thin-film structure; and forming an isolating double layer over the whole organic thin-film transistor and patterning this such that the source and drain electrodes and the gate isolator in the second transistor become exposed, whereafter a layer of pentacene is deposited above the isolating double layer and the exposed portion of the second transistor, the pentacene layer in the exposed portion forming the active semiconductor material of the organic thin-film transistor and being provided electrically isolated against the additional pentacene layer broken by a re-entrant edge of the profile of the isolating double layer.

12. A method according to claim 11, wherein the steps for forming the inorganic thin-film transistor are performed in a tri-layer process which forms an inverted staggered tri-layer structure.

13. A method according to claim 11, wherein the steps forming the inorganic thin-film transistor are performed in a back-channel etch process.

14. A method according to claim 11, further comprising:
isolating the active semiconductor in the form of pentacene in the organic thin-film transistor by a re-entrant profile of a broken double layer of polymethylmetacrylate (PMMA) and Novolac photoresist.

15. A method according to claim 11, further comprising:
evaporating gold thermally for forming the source and drain electrodes of the organic thin-film transistor.

16. A method according to claim 11, further comprising:
removing the pentacene layer which has been deposited over the isolating double layer.

* * * * *